United States Patent
Park et al.

(10) Patent No.: US 8,906,763 B2
(45) Date of Patent: Dec. 9, 2014

(54) METHOD OF MANUFACTURING A DYNAMIC RANDOM ACCESS MEMORY (DRAM) INCLUDING FORMING CONTACT PADS OF ADJACENT CELLS BY LATERALLY ETCHING A CONTACT OPENING OF A CELL THEREBETWEEN

(75) Inventors: Jong-Chul Park, Hwaseong-si (KR); Byung-Jin Kang, Daegu (KR); Sang-Sup Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 212 days.

(21) Appl. No.: 13/540,816

(22) Filed: Jul. 3, 2012

(65) Prior Publication Data

US 2013/0009226 A1  Jan. 10, 2013

(30) Foreign Application Priority Data

Jul. 4, 2011  (KR) .................. 10-2011-0065865

(51) Int. Cl.
*H01L 21/8242* (2006.01)
*H01L 27/108* (2006.01)
*H01L 21/768* (2006.01)

(52) U.S. Cl.
CPC .... *H01L 27/10888* (2013.01); *H01L 27/10855* (2013.01); *H01L 27/10876* (2013.01); *H01L 27/10894* (2013.01); *H01L 21/76897* (2013.01); *H01L 21/76816* (2013.01)
USPC ..... 438/239; 438/381; 438/756; 257/E21.646

(58) Field of Classification Search
CPC ................... H01L 21/76816; H01L 21/76897; H01L 27/10855; H01L 27/10876; H01L 27/10888; H01L 27/10894

USPC .................. 438/239, 381, 756; 257/646
See application file for complete search history.

(56) References Cited

U.S. PATENT DOCUMENTS

| | | | | |
|---|---|---|---|---|
| 7,833,902 | B2 * | 11/2010 | Lee .............................. | 438/647 |
| 8,581,314 | B2 * | 11/2013 | Park et al. ..................... | 257/296 |
| 2007/0184694 | A1 * | 8/2007 | Kim et al. ..................... | 439/179 |
| 2007/0267676 | A1 * | 11/2007 | Kim et al. ..................... | 257/311 |
| 2008/0061352 | A1 * | 3/2008 | Lee et al. ...................... | 257/315 |

FOREIGN PATENT DOCUMENTS

| | | |
|---|---|---|
| JP | 2009-141260 A | 6/2009 |
| KR | 20050045715 A | 5/2005 |
| KR | 20060000552 A | 1/2006 |

* cited by examiner

*Primary Examiner* — Anh Mai
(74) *Attorney, Agent, or Firm* — Harness, Dickey & Pierce

(57) ABSTRACT

A DRAM device includes a substrate including an active region having an island shape and a buried gate pattern. A mask pattern is over an upper surface portion of the substrate between portions of the buried gate pattern. A capping insulating layer fills a gap between portions of the mask pattern. A first pad contact penetrates the capping insulating layer and the mask pattern, and contacts a first portion of the substrate in the active region. Second pad contacts are under the capping insulating layer, and contact a second portion of the substrate in the active region positioned at both sides of the first pad contact. A spacer is between the first and second pad contacts to insulate the first and second pad contacts. A bit line configured to electrically connect with the first pad contact, and a capacitor configured to electrically connect with the second pad contacts, are provided.

16 Claims, 18 Drawing Sheets

CELL REGION (A-A') | PERIPHERAL REGION

CELL REGION (A-A') | PERIPHERAL REGION | CELL REGION (B-B')

METHOD OF MANUFACTURING A DYNAMIC RANDOM ACCESS MEMORY (DRAM) INCLUDING FORMING CONTACT PADS OF ADJACENT CELLS BY LATERALLY ETCHING A CONTACT OPENING OF A CELL THEREBETWEEN

CROSS-REFERENCE TO RELATED APPLICATIONS AND CLAIM OF PRIORITY

This application claims priority under 35 U.S.C. §119(e) to Korean Patent Application No. 10-2011-0065865, filed on Jul. 4, 2011 in the Korean Intellectual Property Office, the contents of which are incorporated herein by reference in its entirety.

BACKGROUND

1. Field

Example embodiments relate to dynamic random access memory (DRAM) devices and/or methods of manufacturing the same. More particularly, the example embodiments relate to DRAM devices and/or methods of manufacturing the same including a pad contact having a wide contacting area.

2. Background

As an integration degree of semiconductor devices increases, a size of a line width of patterns and a size of contact holes included in the semiconductor devices are rapidly decreased. For a DRAM device, pad contacts may be required to make contact (e.g., surface-to-surface contact) with an active region of a substrate. In this case, because a width of the active region is small, a contacting area of the pad contact with the active region may become very small. In order to increase the contacting area between the pad contact and a surface portion of the substrate at the active region, the surface portion of the substrate at the active region and the pad contact may have to substantially overlap. However, increasing the contacting area between the pad contact and the active region, while preventing the generation of defects due to a misalignment, may be a difficult task.

SUMMARY

Example embodiments relate to dynamic random access memory (DRAM) devices and/or methods of manufacturing the same. More particularly, the example embodiments relate to DRAM devices and/or methods of manufacturing the same including a pad contact having a wide contacting area.

Some example embodiments provide a DRAM device including a pad contact having an increased contacting area with an active region in a substrate and preventing a generation of defects due to misalignment.

Some other example embodiments provide methods of manufacturing the above-described DRAM device.

According to some example embodiments, a dynamic random access memory (DRAM) device includes a substrate including an active region having an isolated (or, island) shape. A buried gate pattern is within the substrate. The buried gate pattern extends in a first direction. A mask pattern is disposed on (or, alternately, over) an upper surface portion of the substrate between portions of the buried gate pattern. The mask pattern is formed including a first insulating material. A capping insulating layer fills up a gap between portions of the mask pattern. The capping insulating layer is formed on (or, alternately, over) the portions of the mask pattern, and is formed including a second insulating material different from the first insulating material. A first pad contact penetrates the capping insulating layer and the mask pattern. The first pad contact contacts a first portion of the substrate in the active region. Second pad contacts are provided under the capping insulating layer. The second pad contacts contact a second portion of the substrate in the active region positioned at both sides of the first pad contact in the first direction. A spacer is between the first and second pad contacts to insulate the first and second pad contacts. A bit line is configured to electrically connect with the first pad contact, and a capacitor is configured to electrically connect with the second pad contacts.

In some example embodiments, a bottom portion of the first pad contact may be positioned at a lower level than a bottom portion of each of the second pad contacts.

In some example embodiments, the isolated active region of the substrate may be disposed to make at an angle other than (or, excluding) 90 degrees with respect to the first direction.

In some example embodiments, the first portion of the substrate may correspond to a center portion of the active region, and the second portion of the substrate may correspond to both edge portions of the active region along an extending direction of the active region.

According to some example embodiments, in a method of manufacturing a dynamic random access memory (DRAM) device, a mask pattern of a first insulating material is formed on a substrate including an active region having an isolated (or, island) shape. A buried gate pattern extending in a first direction is formed. The buried gate pattern is within the substrate between portions of the mask pattern. A capping insulating layer of a second insulating material different from the first insulating material is formed. The capping insulating layer is formed on the buried gate pattern and the portions of the mask pattern, and fills up a gap between the portions of the mask pattern. An opening portion penetrating the capping insulating layer and the mask pattern is formed to expose a first portion of the active region. A side portion of the mask pattern at both sides in the first direction in the opening portion is etched to form a first groove and a second groove exposing a second portion of the active region adjacent to the opening portion. Second pad contacts are formed in the first and second grooves to contact the second portion of the active region. A spacer is formed on a sidewall of the opening portion, and on an exposed sidewall of the second pad contacts. A first pad contact is formed in the opening portion including the spacer. The first pad contact contacts the first portion of the active region. A bit line configured to electrically connect with the first pad contact is formed, and a capacitor configured to electrically connect with the second pad contact is formed.

In some example embodiments, the buried gate pattern may be formed as follows. The substrate may be etched using the mask pattern as an etching mask to form a trench. A gate insulating layer may be formed on an inner wall of the trench. A conductive layer filling up the trench may be formed on the gate insulating layer. The conductive layer may be etched back to form the buried gate pattern filling up a lower portion of the trench.

In some example embodiments, the first insulating material of the mask pattern has a different etching selectivity than the second insulating material of the first capping insulating layer.

In some example embodiments, the mask pattern may be formed using silicon oxide, and the first capping insulating layer may be formed using silicon nitride.

In some example embodiments, the etching a side portion of the mask pattern to form the first and second grooves may including performing a wet etching process.

In some example embodiments, a first upper surface portion of the substrate exposed by a bottom portion of the opening portion may be positioned at a lower level than a second upper surface portion of the substrate exposed by the first and second grooves.

In some example embodiments, the forming second pad contacts in the first and second grooves may be performed as follows. A conductive layer may fill up the first and second grooves and the opening portion. The conductive layer is anisotropically etched to expose a surface portion of the substrate using the first capping insulating layer as an etching mask.

In some example embodiments, the conductive layer may include a silicon material layer, and the silicon material layer may be formed by performing a chemical vapor deposition process or an epitaxial process.

In some example embodiments, the mask pattern may be formed higher than a height of the second pad contacts.

In some example embodiments, the mask pattern may remain on a sidewall of the first and second grooves after forming the first and second grooves.

In some example embodiments, the substrate may be separated into a cell region and a peripheral region. The capping insulating layer formed on the substrate in the peripheral region may be removed. A planar-type transistor may be formed on the substrate excluding the capping insulating layer in the peripheral region.

According to another example embodiment, a method of manufacturing a dynamic random access memory (DRAM) device, includes forming a gate structure over substrate including an active region having an island shape. The gate structure includes a mask pattern, a buried gate pattern extending in a first direction and partially filling a trench in the substrate, and a first capping insulating layer over the buried gate pattern and the mask pattern. The buried gate and the mask pattern are alternately arranged in a second direction substantially perpendicular to the first direction. The first capping insulating layer fills a remaining portion of the trench, and is formed of an insulating material that has a different etching selectivity with respect to that of the mask pattern. An opening portion is formed penetrating the gate structure to expose a first portion of the active region. Sidewalls of the mask pattern are partially etched along the first direction in the opening portion to form a first groove and a second groove configured to expose a second portion of the active region adjacent to the opening portion. Second pad contacts are formed in the first and second grooves. A lower surface of the second pad contacts a first upper surface portion of the substrate corresponding to the second portion in the active region. A spacer is formed partially filling the opening portion and on exposed sidewalls of the second pad contacts. A first pad contact is formed filling in a remaining portion of the opening portion. A lower surface of the first pad contact contacts a second upper surface portion of the substrate corresponding to the first portion of the active region. A bit line configured to electrically connect with the first pad contact, a capacitor configured to electrically connect with the second pad contacts, are formed.

In some example embodiments, partially etching sidewalls of the mask pattern to form the first and second grooves may include selectively removing other portions of the mask pattern by performing a wet etching process.

In some example embodiments, forming the opening portion may comprise forming a capping insulating layer pattern over the buried gate pattern by etching the first capping insulating layer. A second capping insulating layer is formed over an upper surface of the first capping insulating layer pattern. The second capping insulating layer, the first capping insulating layer pattern and the first mask pattern may be etched to form the opening portion.

In some example embodiments, the mask pattern partially overlaps with the second pad contacts in a vertical direction.

In some example embodiments, the second upper surface portion may be formed higher than the first upper surface portion.

As described above, the opening portion may be expanded to form a groove, and a pad contact may be formed in the groove in accordance with example embodiments. A generation of a misalignment may be prevented, and a contacting area may be secured. In addition, a generation of damage onto the contacting area may be prevented to form the pad contact having a good contacting characteristic. A DRAM device having a high integration degree and a good operating characteristic may be manufactured.

BRIEF DESCRIPTION OF THE DRAWINGS

Example embodiments will be more clearly understood from the following detailed description taken in conjunction with the accompanying drawings. FIGS. 1 to 27 represent example embodiments as described herein.

FIG. 1 is a perspective view of a pad contact structure in a DRAM device in accordance with an example embodiment.

FIGS. 2 to 5 are perspective views for explaining a method of forming the pad contact structure illustrated in FIG. 1.

FIGS. 7 to 21 are cross-sectional views and plan views for explaining a method of manufacturing a DRAM device illustrated in FIGS. 6A and 6B.

FIGS. 22 to 25 are cross-sectional views for explaining a method of manufacturing a DRAM device illustrated in FIGS. 6A and 6B in accordance with still another example embodiment.

FIG. 26 is a plan view of a memory module including a DRAM chip having a DRAM device in accordance with yet another example embodiment.

FIG. 27 is a block diagram of an electronic system including a DRAM chip having a DRAM device in accordance with yet still another example embodiment.

DETAILED DESCRIPTION OF THE EMBODIMENTS

Figure 1:
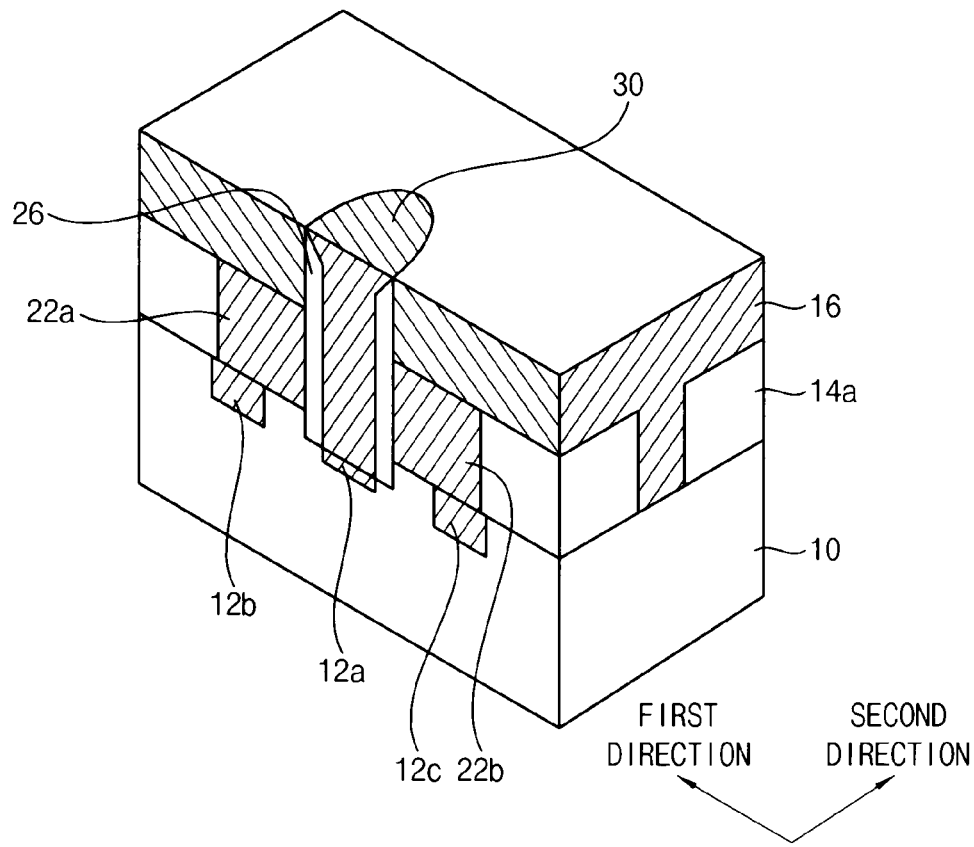

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Example embodiments relate to dynamic random access memory (DRAM) devices and/or methods of manufacturing the same. More particularly, the example embodiments relate to DRAM devices and/or methods of manufacturing the same including a pad contact having a wide contacting area.

Hereinafter, example embodiments of methods of manufacturing a DRAM device in accordance with example embodiments will be explained in detail.

First Embodiments

FIG. 1 is a perspective view of a pad contact structure in a DRAM device in accordance with an example embodiment.

Referring to FIG. 1, a pad contact structure may include a substrate 10 having a plurality of pad regions 12a, 12b and 12c, an insulating layer pattern 14a provided on the substrate 10, a capping insulating layer 16 filling up a gap between portions of the insulating layer pattern 14a and being provided on the insulating layer pattern 14a, a first pad contact 30 penetrating the capping insulating layer 16 and the insulating layer pattern 14a, second pad contacts 22a and 22b provided under the capping insulating layer 16, and a spacer 26 for insulating the first and second pad contacts 30, 22a and 22b from each other between the first pad contact 30 and the second pad contacts 22a and 22b.

In the substrate 10, at least three pad regions 12a, 12b and 12c may be included. Hereinafter, the three pad regions may be referred to as first, second, and third pad regions 12a, 12b and 12c. The first, second, and third pad regions 12a, 12b and 12c may have an isolated (or, island) shape and may be disposed in parallel to each other along a first direction. The reference pad region in the center portion may be the first pad region 12a and neighboring pad regions disposed at both sides of the first pad region 12a may be the second and third pad regions 12b and 12c. The first to third pad regions 12a, 12b and 12c may be an impurity doped substrate region, or a conductive pattern.

The insulating layer pattern 14a formed on the substrate 10 may function as an insulating interlayer, and may include silicon oxide.

The capping insulating layer 16 may be formed using a material having an etching selectivity with respect to the insulating layer pattern 14a. The capping insulating layer 16 may be formed using a different material from that of the insulating layer pattern 14a. Particularly, the capping insulating layer 16 may include silicon nitride. On the substrate 10, silicon oxide of the insulating interlayer pattern 14a and silicon nitride of the capping insulating layer 16 may be alternately disposed in a second direction, which is substantially perpendicular to the first direction. On upper surface portion of the insulating layer pattern 14a, only silicon nitride of the capping insulating layer 16 may be provided.

The first pad contact 30 may contact the first pad region 12a among the pad regions in the substrate 10. A contacting portion of an upper surface of the substrate 10 (i.e., a portion that makes contact with the first pad contact 30) may have a recessed shape with respect to a remaining portion of the upper surface of the substrate 10 near the contacting portion. That is, the contacting portion of the substrate 10 that makes contact with the first pad contact 30 may have a relatively low upper surface portion.

The second pad contacts 22a and 22b may make contact with the second and third pad regions 12b and 12c, respectively, neighboring the first pad region 12a. The second pad contacts 22a and 22b may face the first pad contact 30 and be in parallel to each other along the first direction. The second pad contacts 22a and 22b may both have a symmetric shape with reference to the first pad contact 30. Contacting portions of the substrate 10 making contact with the second pad contacts 22a and 22b, respectively, may have a higher upper surface portion than the contacting portion of the substrate 10 making contact with the first pad contact 30. Accordingly, bottom portions of the second pad contacts 22a and 22b may be positioned at a higher level than a bottom portion of the first pad contact 30. In addition, because the second pad contacts 22a and 22b may be positioned under the capping insulating layer 16, upper surface portions of the second pad contacts 22a and 22b may be lower than an upper surface portion of the first pad contact 30.

The spacer 26 may have a shape surrounding a sidewall of the first pad contact 30. The spacer 26 may insulate two neighboring second pad contacts 22a and 22b from the first pad contact 30 along the first direction.

FIGS. 2 to 5 are perspective views for explaining a method of forming the pad contact structure illustrated in FIG. 1.

Figure 2:
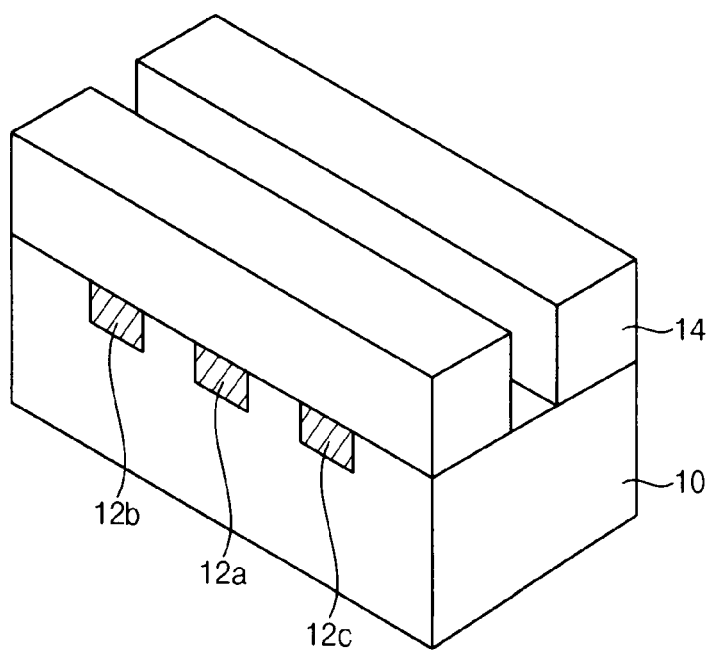

Referring to FIG. 2, a substrate 10 including a plurality of pad regions 12a, 12b and 12c may be provided. As described above, three pad regions 12a, 12b and 12c may be provided in the substrate 10, and each of the pad regions 12a, 12b and 12c may have an isolated (or, island) shape and may be disposed parallel to each other in a first direction.

A first insulating layer may be formed on the substrate 10, and then may be patterned to form a preliminary first insulating layer pattern 14. The preliminary first insulating layer pattern 14 may have a line shape (i.e., be shaped in the form of a line) to cover the pad regions 12a, 12b and 12c provided parallel to each other in the first direction. The preliminary first insulating layer pattern 14 may be formed using silicon oxide.

Figure 3:
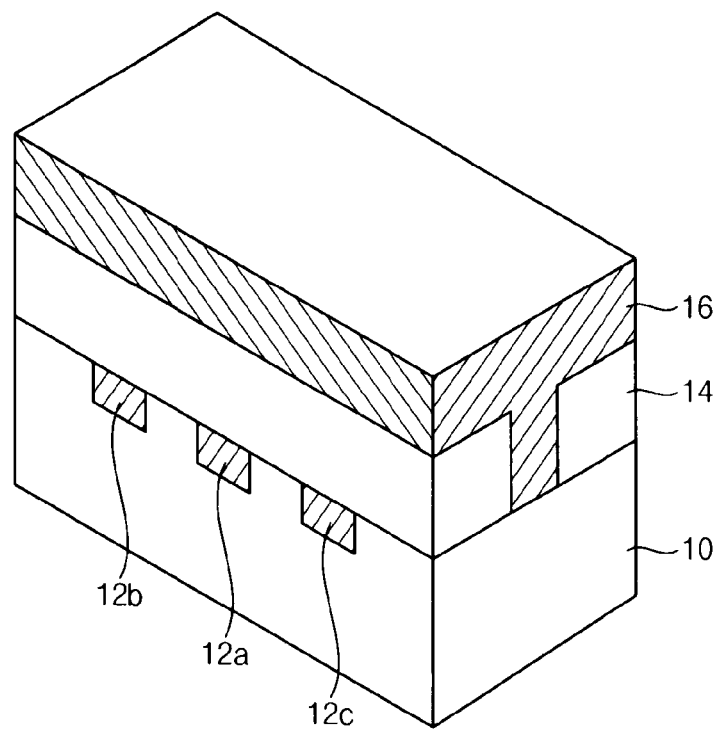

Referring to FIG. 3, a capping insulating layer 16 filling up a gap between portions of the preliminary first insulating layer pattern 14 may be formed on the preliminary first insulating layer pattern 14. The capping insulating layer 16 may be formed by depositing a material having an etching selectivity with respect to the preliminary first insulating layer pattern 14.

Figure 4:
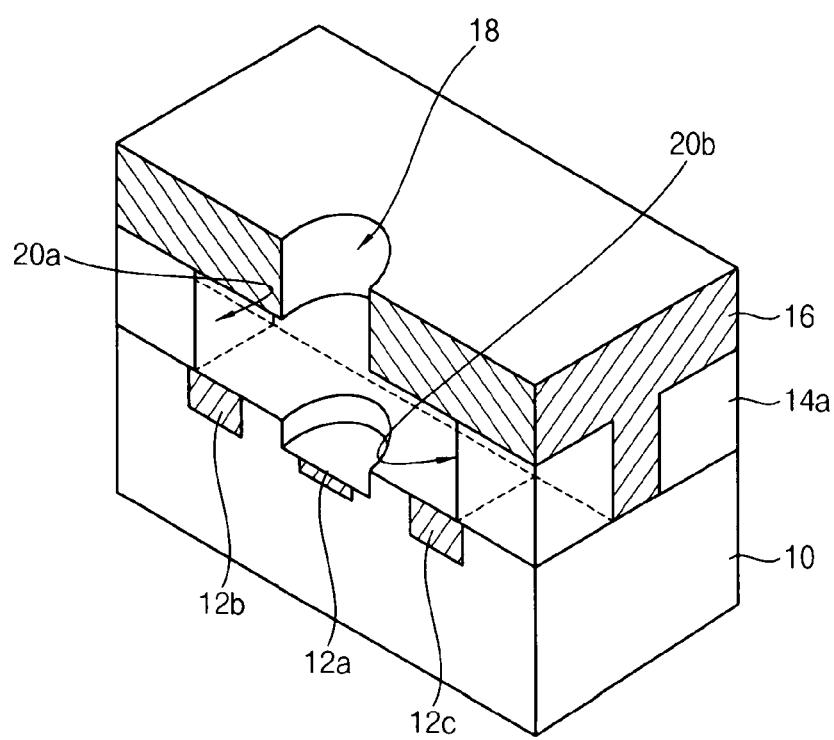

Referring to FIG. 4, the capping insulating layer 16 and the preliminary first insulating layer pattern 14 may be etched one by one to form a first opening portion 18 exposing the first pad region 12a among the pad regions. Through a bottom portion of the first opening portion 18, a whole upper surface portion of the first pad region 12a may be exposed, if desired.

Then, the preliminary first insulating layer pattern 14 exposed through a sidewall of the first opening portion 18 may be selectively etched to form first and second grooves 20a and 20b connected to a lower portion of the first opening portion 18. A first insulating layer pattern 14a may be formed by performing the above-described processes. The first and second grooves 20a and 20b may be formed by a wet etching process. That is, the first and second grooves 20a and 20b may be formed by performing a wet etching process using an etching solution possibly etching silicon oxide rapidly but etching silicon nitride rarely. That is, the etching solution may selectively etch the silicon oxide.

Through bottom portions of the first and second grooves 20a and 20b, the second and third pad regions 12b and 12c neighboring the first pad region 12a may be exposed. Because the first and second grooves 20a and 20b may be formed by the wet etching process, a loss of the second and third regions 12b and 12c may be reduced (or, alternatively, minimal) while performing the etching process. Accordingly, an upper surface portion of the second and third pad regions 12b and 12c exposed by the first and second grooves 20a and 20b may be positioned at a higher level than an upper surface portion of the first pad region 12a exposed through the bottom portion of the first opening portion 18.

Figure 5:
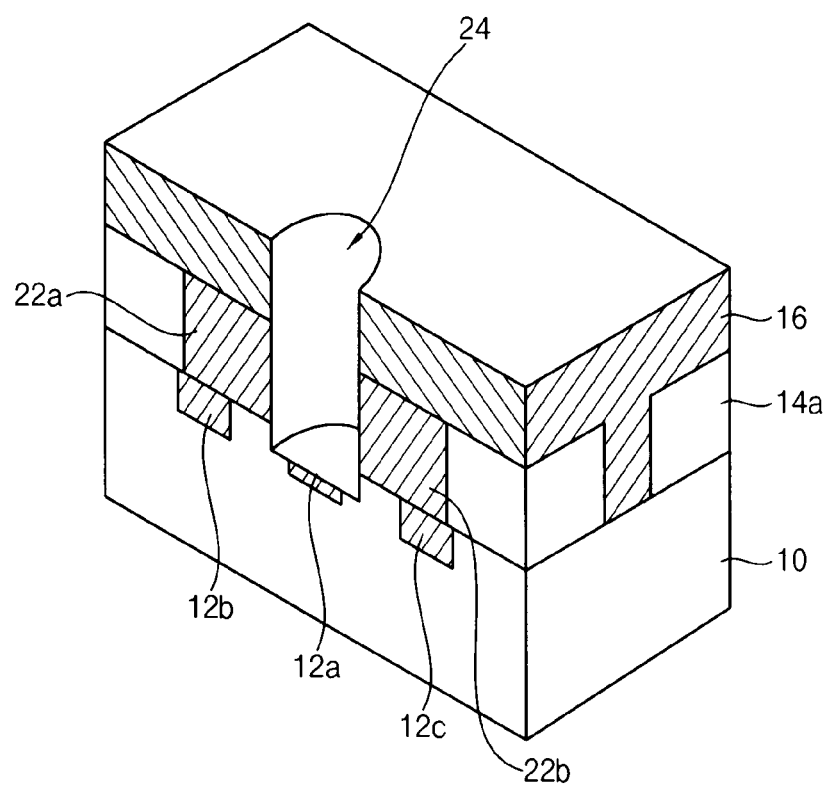

Referring to FIG. 5, a conductive layer (not illustrated) filling up the first and second grooves 20a and 20b and the first opening portion 18 may be formed. Particularly, the conductive layer may be an impurity doped polysilicon layer.

The conductive layer may be etched back to form second pad contacts 22a and 22b in the first and second grooves 20a and 20b, respectively. The capping insulating layer 16 may function as an etching mask while performing the etch back process. Accordingly, a process of forming a separate etching mask pattern may not be required. Through performing the By performing an etch back process, a second opening portion 24 having the same shape as the first opening portion 18 may be formed.

A spacer layer 26 may be formed on a sidewall of the second opening portion 24 as illustrated in FIG. 1. Then, a conductive layer filling up the second opening portion 24 may be formed and then a planarization process may be performed. In the second opening portion 24, a first pad contact 30 may be formed.

Because a vertical etching process with respect to a thin layer may not be performed while forming the second pad contacts 22a and 22b in accordance with example embodiments, a layer contacting the second pad contacts 22a and 22b may be rarely damaged. Accordingly, the pad contact structure may have a good contacting characteristic. In addition, a separate photolithography process for forming the second pad contacts 22a and 22b may not be required, and so, defects due to misalignment may not be generated while forming the second pad contacts 22a and 22b.

Second Embodiments

Figure 6A:
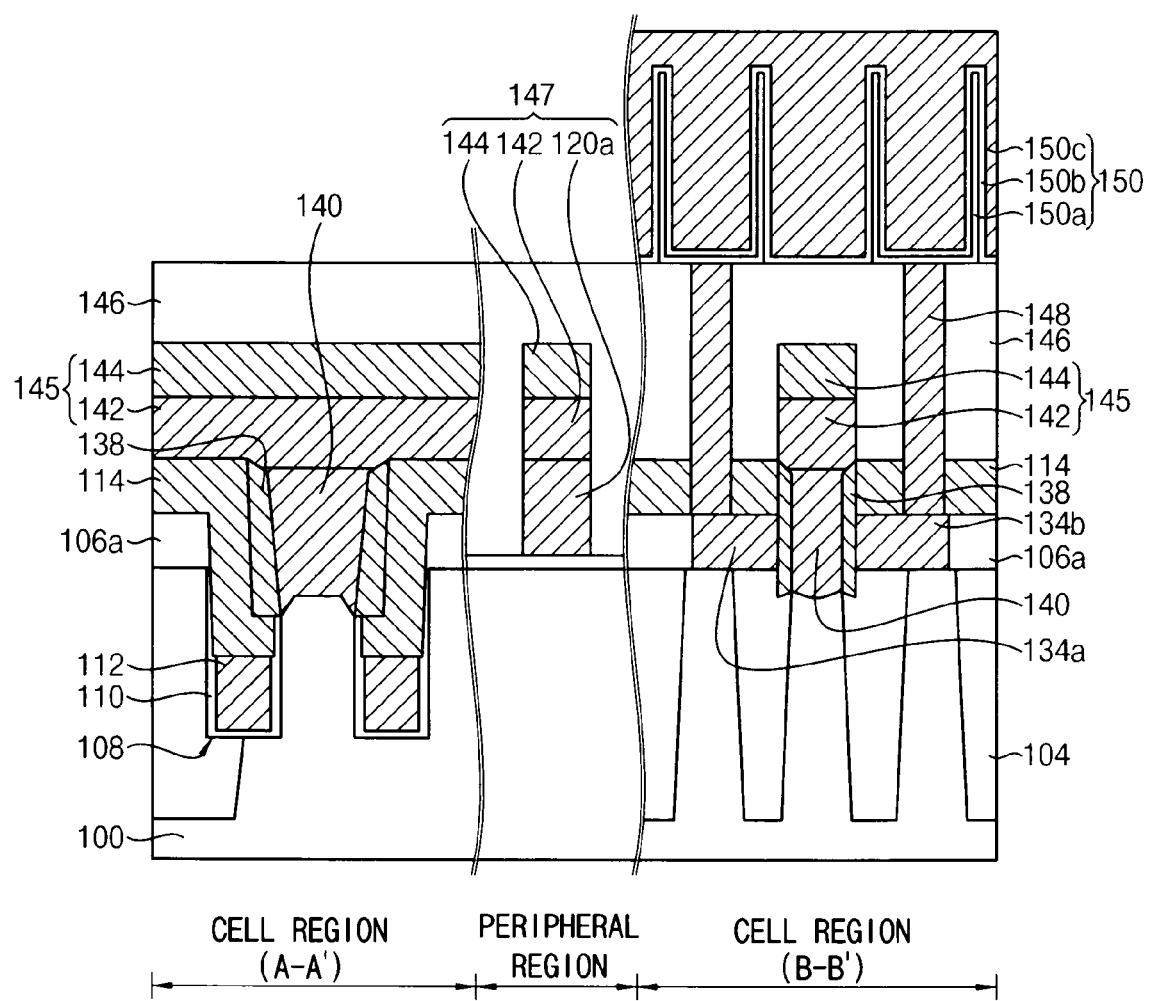
FIG. 6A is a cross-sectional view of a DRAM device in accordance with another example embodiment.
Figure 6B:
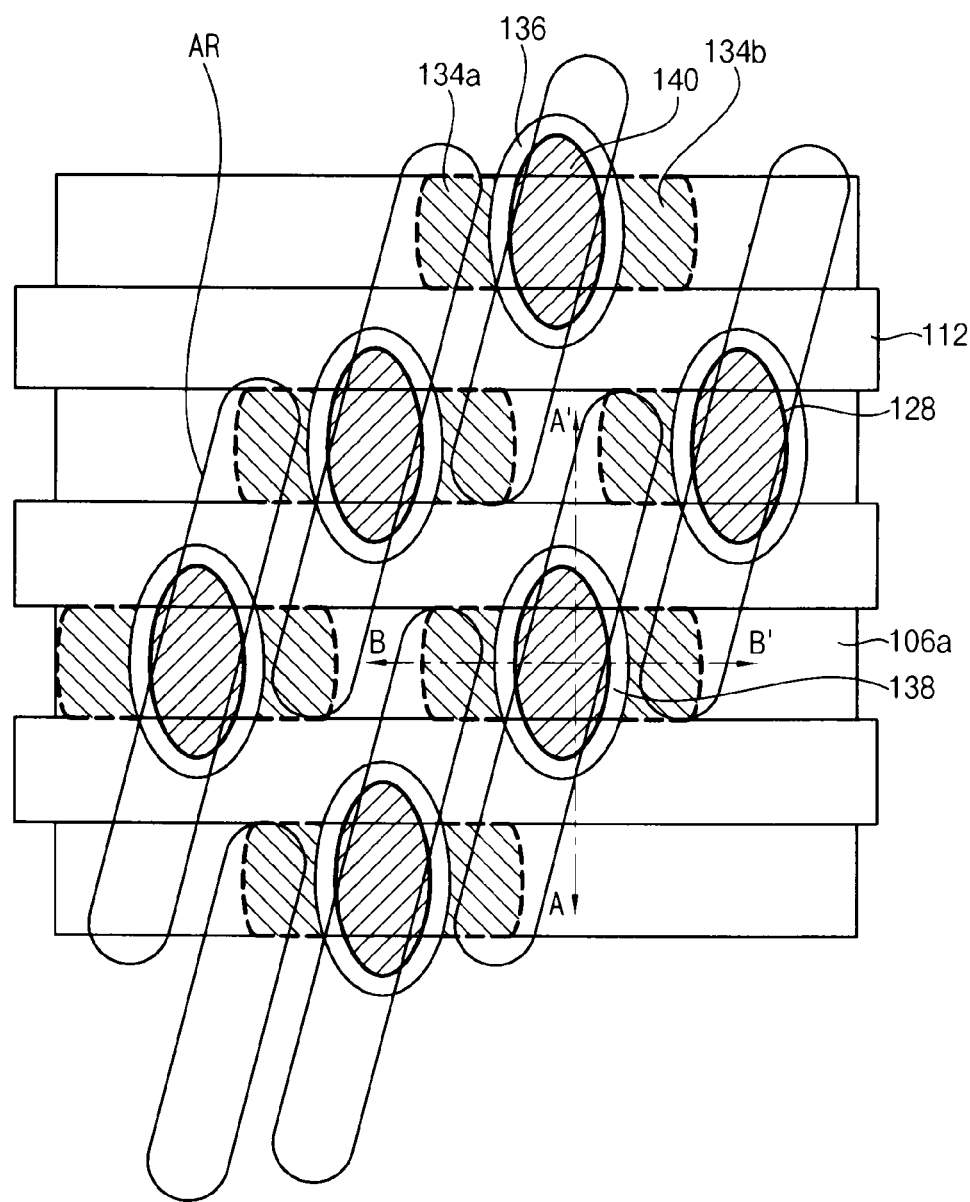
FIG. 6B is a plan view of a cell region of the DRAM device shown in FIG. 6A.

FIG. 6A is a cross-sectional view of a DRAM device in accordance with another example embodiment. FIG. 6B is a plan view of a cell region of the DRAM device shown in FIG. 6A. FIG. 6A illustrates cross-sectional views cut along a line A-A' and B-B' in FIG. 6B along with a cross-sectional view in a peripheral circuit region.

Referring to FIGS. 6A and 6B, a DRAM device in this example embodiment include a cell region configured for forming memory cells, and a peripheral circuit region configured for forming peripheral circuits, may be formed on a substrate 100.

Active regions having an isolated (or, island) shape may be formed in the cell region of the substrate 100. The DRAM device may include a gate electrode 112 having a buried structure in a trench 108 formed in the substrate 100, a first mask pattern 106a formed on the substrate 100 between the buried gate electrodes 112, a first capping insulating layer 114 covering the buried gate electrode 112 and the first mask pattern 106a, a first pad contact 140 having a penetrating shape into the first capping insulating layer 114 and the first mask pattern 106a and making a contact with a first pad region in the active region, second pad contacts 134a and 134b provided under the first capping insulating layer 114 and making a contact with a second pad region in the active region, and a spacer 138 provided between the first pad contact 140 and the second pad contacts 134a and 134b to insulate the first pad contact 140 from the second pad contacts 134a and 134b. Bit line structures 145 (including a metal pattern 142 and a hard mask pattern 144) electrically connected with the first pad contact 140 may be also provided. In addition, a capacitor 150 electrically connected with the second pad contacts 134a and 134b may be provided.

A planar-type MOS transistor may be provided on the substrate 100 in the peripheral region. A gate electrode of the planar-type MOS transistor may include a polysilicon layer pattern 120a, a metal pattern 142 and a hard mask pattern 144 integrated one by one. The metal pattern 142 and the hard mask pattern 144 in the peripheral region may be formed using the same material as the metal pattern 142 and the hard mask pattern 144 included in the bit line structure 145 in the cell region.

The substrate 100 may be separated into an active region AR and a device isolation region by forming a device isolating layer pattern 104. The active regions AR excluding the device isolating layer pattern 104 may have an isolated (or, island) shape, and may be disposed repeatedly. When an extending direction of the buried gate electrode 112 is set to a first direction, the active regions AR may be arranged in a direction not perpendicular to the first direction (i.e., at an angle other than 90 degrees to the first direction).

Figure 9:
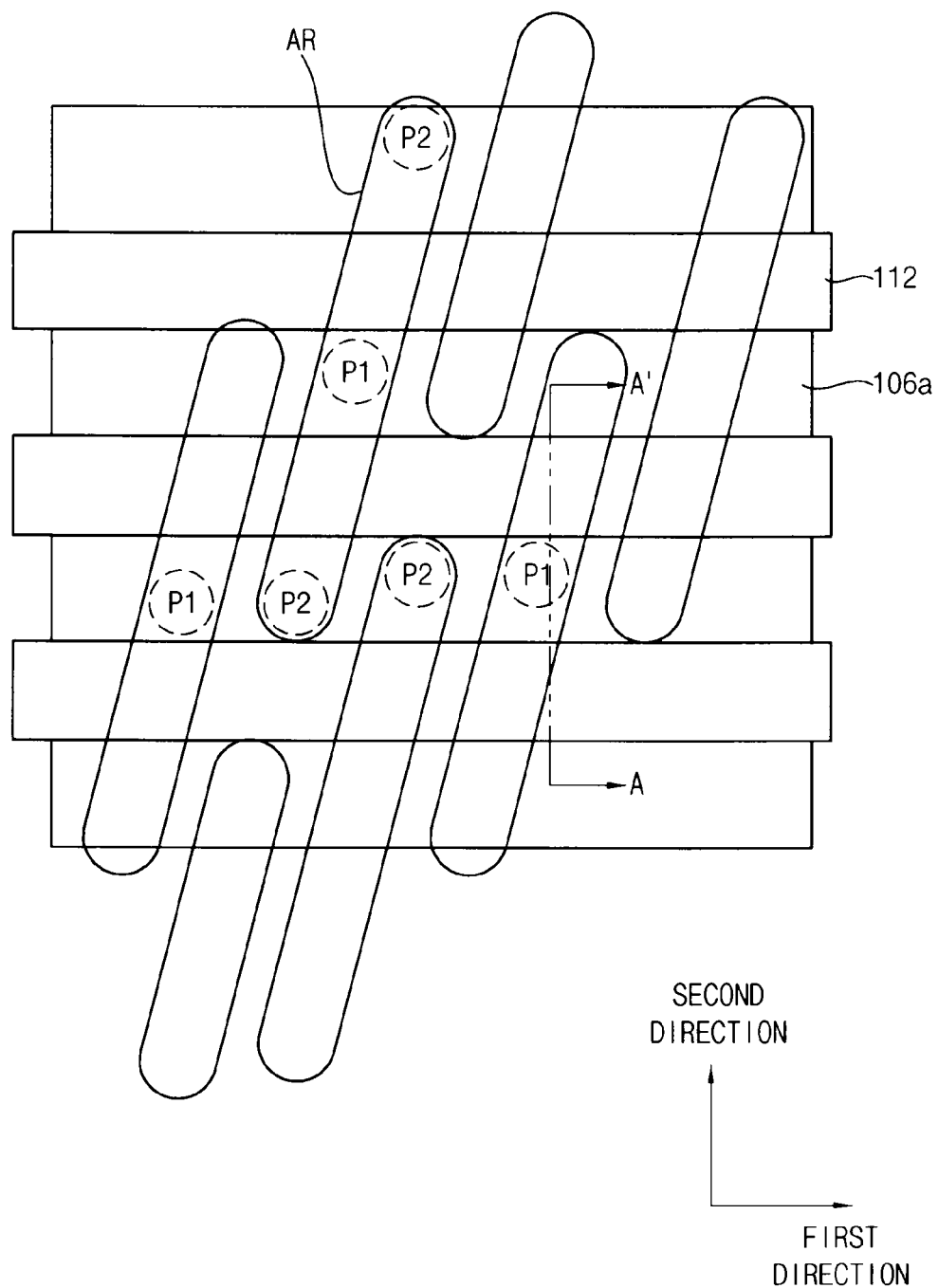

A center portion of the active region AR with reference to an extending direction of the isolated active region AR may be a first pad region P1 as illustrated in FIG. 9. In addition, edge portions of the active region AR with reference to the extending direction of the isolated active region AR may be second pad regions P2 as illustrated in FIG. 9. One isolated active region AR may include one of the first pad region, and two of the second pad regions.

The first pad regions in one of the active regions AR may face second pad regions in other neighboring active regions at both sides in the first direction. That is, two of the second pad regions may be provided between the first pad regions in the first direction.

A buried gate may include a gate insulating layer 110 formed along a surface portion of the trench 108, and the buried gate electrode 112 formed on the gate insulating layer 110 and provided on a lower portion of the trench 108. The buried gate electrode 112 may include polysilicon. Source/drain regions may be provided in the substrate 100 at both sides of the buried gate electrode 112. The source/drain regions may include a highly doped region and a lightly doped region.

Because the first mask pattern 106a may function as an insulating interlayer, the first mask pattern 106a may include an insulating material. The first mask pattern 106a may include silicon oxide.

The first capping insulating layer 114 may include a material having an etching selectivity with respect to the first mask pattern 106a. The first capping insulating layer 114 may include silicon nitride.

The first pad contact 140 may make contact with the first pad region, which may correspond to the active region AR electrically connected with the metal pattern 142 provided as the bit line. The active regions AR of the substrate 100 corresponding to the first pad region may have a recessed shape with respect to surrounding portions. That is, the substrate 100 in the first pad region may have an upper surface portion having a lower level than the substrate 100 in the active region excluding the first pad region. Accordingly, a bottom portion of the first pad contact 140 may be provided at a lower level than an upper surface portion of the surrounding substrate excluding the first pad region. The first pad contact 140 may include a conductive material (e.g., an impurity doped polysilicon).

The second pad contacts 134a and 134b may contact the second pad region, which may correspond to an active region AR electrically connected with the capacitor 150. The second pad region may have an upper surface portion higher than the first pad region. Accordingly, a bottom portion of the second pad contacts 134a and 134b may be positioned at a higher level than a bottom portion of the first pad contact 140. In addition, the second pad contacts 134a and 134b may have a lower upper surface portion than that of the first pad contact 140 because the second pad contacts 134a and 134b may be disposed under the first capping insulating layer 114.

The spacer 138 may have a shape surrounding the first pad contact 140. The spacer 138 may insulate the first pad contact 140 from two neighboring second pad contacts 134a and 134b in the first direction. The first pad contact 140 and the two neighboring second pad contacts 134a and 134b in the first direction may be disposed in different isolated active regions, respectively.

On the first pad contact 140, the bit line structure 145 may be provided. The bit line structure 145 may have an integrated structure of the metal pattern 142 and the hard mask pattern 144.

In addition, a storage node contact 148 and the capacitor 150 may be provided on the second pad contacts 134a and 134b. An insulating interlayer 146 may be provided between the storage node contact 148 and the capacitor 150.

In the DRAM device having the above-described structure, a loss of the substrate may be rarely observed in the active region at the connecting portion with the capacitor. In addition, misalignment of the pad contact for electrically connecting the capacitor with the active region may rarely occur. Accordingly, a generation of an operation defect and a reliability defect due to a poor contact between the capacitor and the active region may be decreased (or, alternatively, prevented).

FIGS. 7 to 21 are cross-sectional views and plan views for explaining a method of manufacturing a DRAM device illustrated in FIGS. 6A and 6B.

The cross-sectional views in the cell region may be obtained by cutting along a line A-A' illustrated in FIG. 9.

Figure 7:
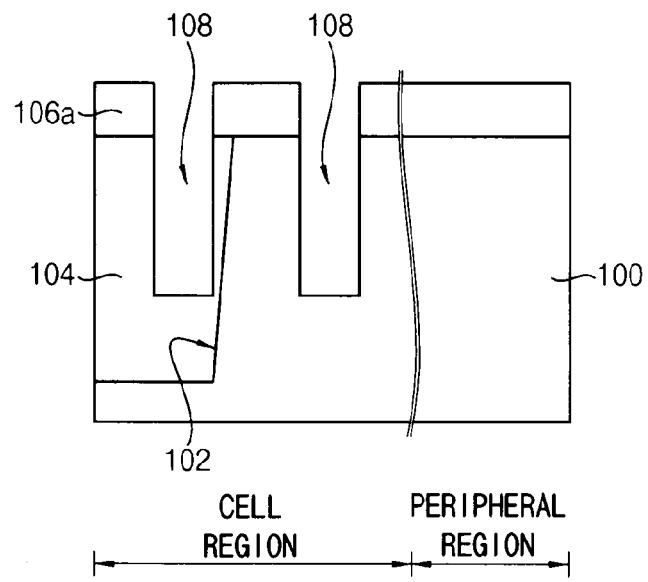

Referring to FIG. 7, a trench for isolating device 102 may be formed in a substrate 100 including a cell region configured for forming memory cells and a peripheral region configured for forming peripheral circuits. An inner portion of the trench for isolating device layer 102 may be filled up with an insulating material to form a device isolating layer pattern 104. An active region AR as illustrated in FIG. 9 and a device isolation region may be separated in the substrate 100 by the device isolating layer pattern 104.

Source and drain regions (not illustrated) may be formed by doping impurities into an upper portion of the substrate 100. Upper portions of the source and drain regions may be highly doped, and lower portions of the source and drain regions may be lightly doped by controlling doping concentration of impurities.

Referring to FIG. 9, the active regions AR may have an isolated (or, island) shape, and may be disposed repeatedly. The active regions AR may be disposed to make an angle excluding 90 degrees with respect to a first direction, which may be an extending direction of a buried gate electrode 112 to be formed in a following process.

As described above, a center portion of each of the active regions AR may be a first pad region P1 with reference to an extending direction of the isolated active region AR. In addition, both edge portions of each of the active regions AR may be second pad regions P2 with reference to an extending direction of the isolated active region AR. Referring to the disposed relation of each of the pad regions in the first direction, two of the second pad regions may be provided between the first pad regions. That is, the both end portions of the active region AR with reference to the extending direction of the active region AR may face the center portion of the neighboring active region AR in the first direction.

A trench 108 may be formed in a region for forming a buried gate in the substrate 100. A first mask layer (not shown) may be formed on the substrate 100. Particularly, the first mask layer may be formed by depositing silicon oxide. Then, the first mask layer may be patterned to form a first mask pattern 106a. The first mask pattern 106a may be formed to have substantially the same height as the first pad contact to be formed in a following process. Accordingly, the thickness of the first mask pattern 106a may be determined considering the desired height of the first pad contact. The first mask pattern 106a may have an extending shaped in the first direction.

The exposed active region and the device isolation region of the substrate 100 may be etched using the first mask pattern 106a as an etching mask to form the trenches 108. Particularly, the buried gate may be formed only in the cell region. Accordingly, the trenches 108 may be formed only in the cell region of the substrate 100.

Figure 8:
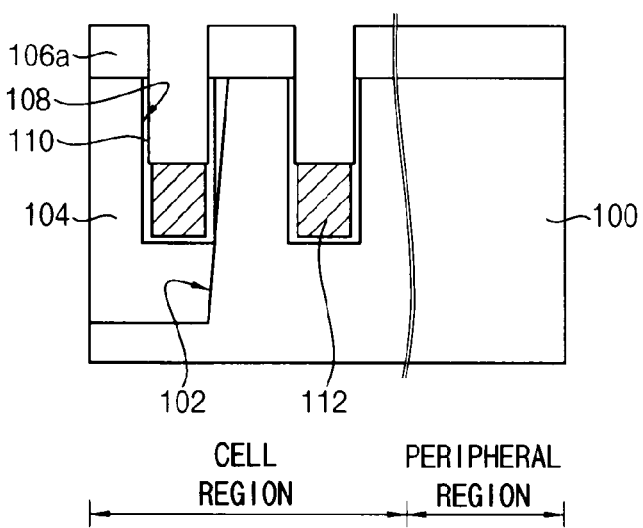

Referring to FIG. 8, a gate insulating layer 110 may be formed on an inner wall of the trench 108. The gate insulating layer 110 may be formed using silicon oxide. The silicon oxide layer may be formed by a thermal oxidation process. Alternatively, the gate insulating layer 110 may be formed using a material having a high dielectricity.

A polysilicon layer (not shown) may be formed on the gate insulating layer 110. The inner portion of the trench 108 may be completely filled up with polysilicon while performing the forming process of the polysilicon layer.

The polysilicon layer may be etched back with respect to a whole (or, alternatively, entire) substrate 100. The polysilicon layer on the first mask pattern 106a may be removed by the etch back process, and the polysilicon may remain at the inner and lower portion of the trench 108. The remaining polysilicon at the inner and lower portion of the trench 108 may become a buried gate electrode 112. An upper surface portion of the remaining polysilicon after performing the etch back process (i.e., the upper surface portion of the buried gate electrode 112) may be positioned at a lower level than the substrate 100 in the active region.

The buried gate electrode 112 crossing each of the active regions AR may be formed through performing the above-described process as illustrated in the plan view in FIG. 9. The buried gate electrode 112 may have a shape extending in the first direction. Two of the buried gate electrodes 112 may cross one isolated active region AR. In addition, the buried gate electrode 112 may be disposed between the first pad region P1 and the second pad region P2 in one of the isolated active region AR to separate the first and second pad regions P1 and P2.

Figure 10:
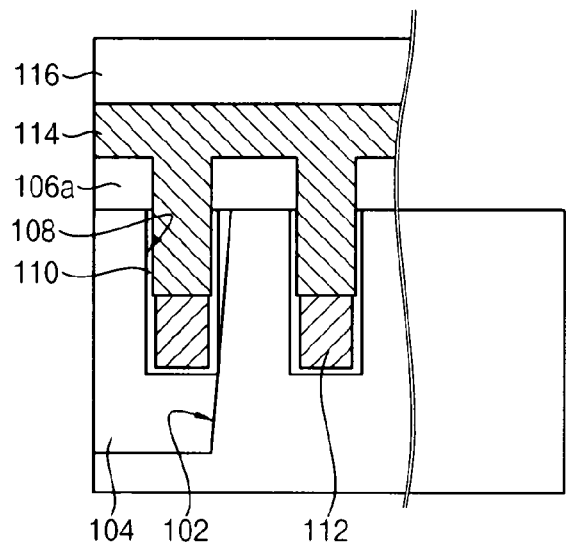

Referring to FIG. 10, a first capping insulating layer 114 filling up the inner portion of the trench 108 and covering the first mask pattern 106a may be formed. The first capping insulating layer 114 may be formed using a material having an etching selectivity with respect to the first mask pattern 106a. Particularly, the first capping insulating layer 114 may be formed by depositing silicon nitride.

On the surface portion of the substrate 100 not facing the buried gate electrode 112, the first mask pattern 106a extending in the first direction may be disposed. Between portions of the first mask pattern 106a, the first capping insulating layer 114 may be formed. Accordingly, the first mask pattern 106a and the first capping insulating layer 114 may be alternately formed on the surface portion of the substrate 100 in the second direction. In addition, the upper surface portion of the first mask pattern 106a may be covered with the first capping insulating layer 114.

A photoresist may be coated to form a photoresist layer (not illustrated) on the first capping insulating layer 114. Generally, the photoresist layer may be formed to have a desired thickness by controlling a photoresist coating recipe. An exposing process and a developing process may be performed to remove the photoresist layer formed in the peripheral region. A photoresist pattern 116 covering the substrate 100 in the cell region may be formed.

The first capping insulating layer 114 and the first mask pattern 106a formed in the peripheral region may be completely removed by using the photoresist pattern 116 as an etching mask. Particularly, the first capping insulating layer 114 formed by using silicon nitride may be removed by performing a dry etching process and the first mask pattern 106a formed by using silicon oxide may be removed by performing a wet etching process. Damage onto the substrate 100 accompanied by an etching process may be decreased through removing the first mask pattern 106a by the wet etching process.

After completing the removing process of the first capping insulating layer 114 and the first mask pattern 106a in the peripheral region, the peripheral region may have a lower step than the cell region. The surface portion of the substrate 100 may be exposed in the peripheral region.

Figure 11:
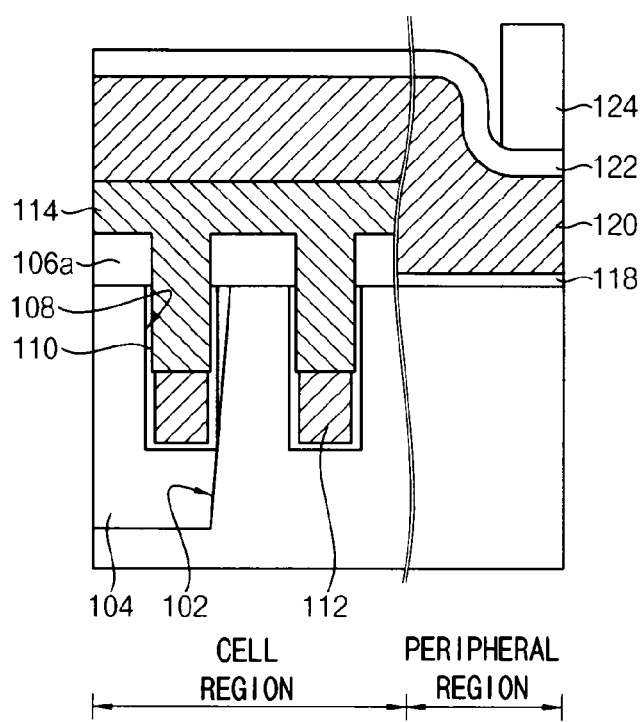

Referring to FIG. 11, a gate insulating layer 118 and a polysilicon layer 120 may be formed to form a planar-type transistor in the peripheral region. The polysilicon layer 120 may be formed (or, configured) to provide a gate electrode of the transistor. A second mask layer 122 may be formed on the polysilicon layer 120. The second mask layer 122 may be formed by depositing silicon oxide or silicon nitride.

A photoresist layer (not illustrated) may be formed on the second mask layer 122. An exposing process and a developing process may be performed to remove the photoresist layer in the cell region, and a portion of the peripheral region, to form a second photoresist pattern 124 in the peripheral region.

Figure 12:
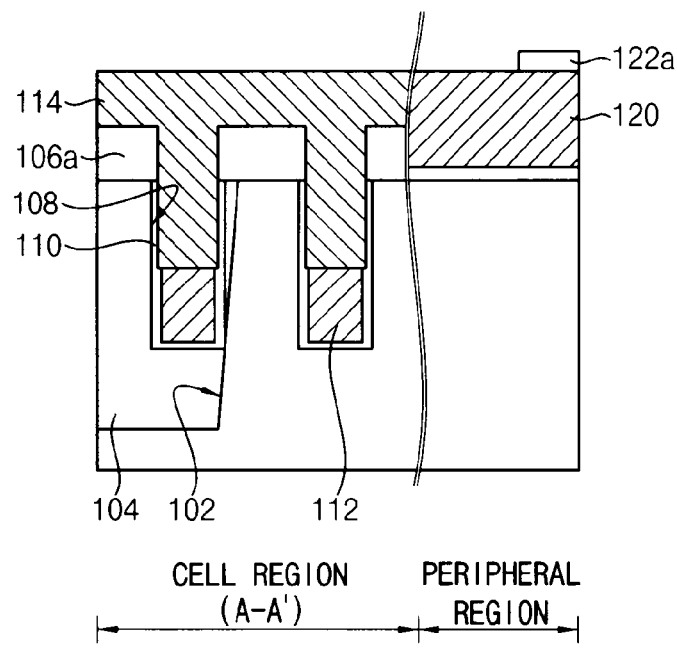

Referring to FIG. 12, the second mask layer 122 may be removed by performing an etch back process using the second photoresist pattern 124 as an etching mask. A portion of the polysilicon layer 120 may be also removed to a certain degree. The exposed polysilicon layer may be polished by a chemical mechanical polishing process to remove the polysilicon layer in the cell region, and a portion of the polysilicon layer in the peripheral region.

While performing the polishing process, a portion of the polysilicon layer 120 in the peripheral region may be passivated by the second mask layer 122, and may be hardly removed. Most of the second mask layer 122 in the peripheral region may not be polished by the polishing process. In the cell region, the second mask layer 122 may be removed by the etch back process to expose the polysilicon layer 120. Accordingly, the polysilicon layer 120 in the cell region may be removed by the polishing process. After completing the polishing process, the first capping insulating layer 114 may be exposed at an uppermost portion of the substrate 100 in the cell region. A second mask pattern 122a may be exposed be formed at an uppermost portion of the substrate 100 in the peripheral region. The polysilicon layer 120 may be exposed in the peripheral region at a border portion of the cell region and the peripheral region. After completing the polishing process, a step between the cell region and the peripheral region may practically disappear.

Figure 13:
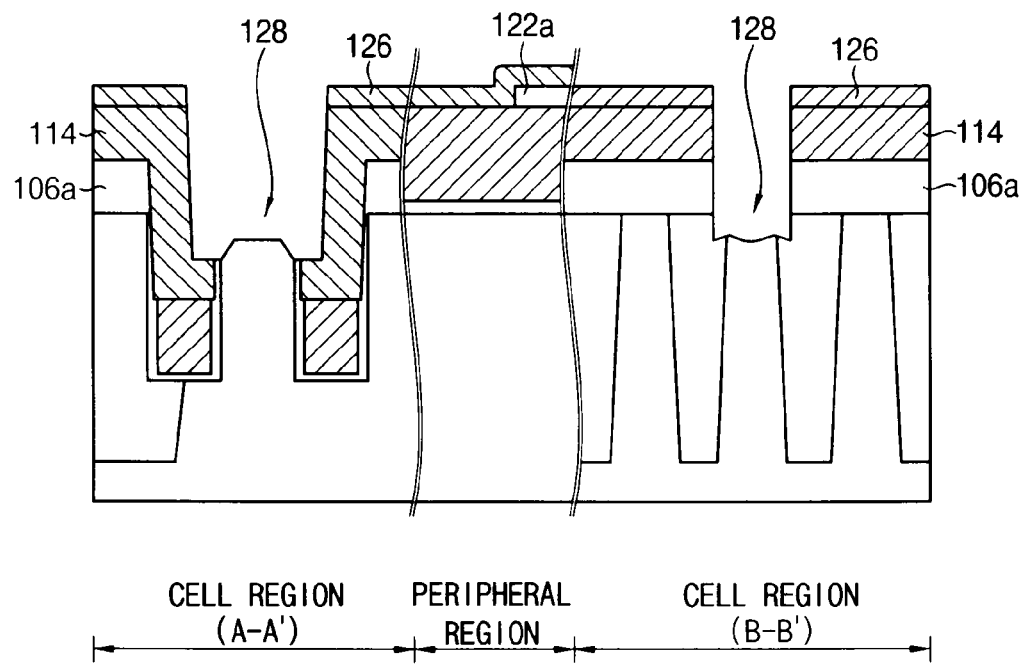
Figure 14:
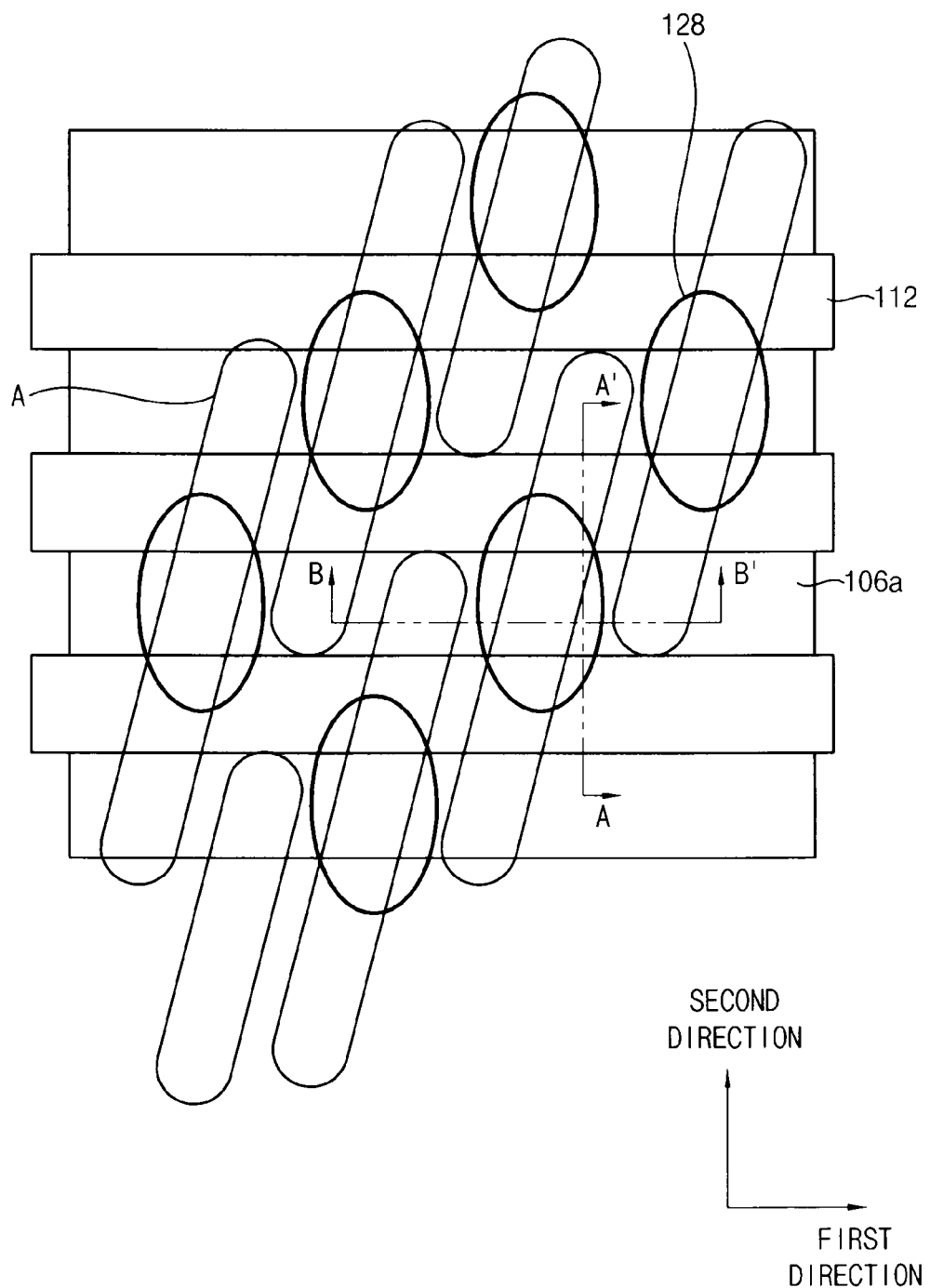

FIGS. 13 to 21 illustrate cross-sectional views cut along a line A-A' and cross-sectional views cut along a line B-B' in FIG. 14, and cross-sectional views of the peripheral region.

Referring to FIG. 13, a second capping layer 126 may be formed on surface portions of the exposed first capping insulating layer 114, the exposed polysilicon layer 120 and the exposed second mask pattern 122a. The second capping layer 126 may be formed by depositing silicon nitride to a thickness of about 100 Å or less.

On the second capping layer 126, a photoresist (not shown) may be coated. An exposing process and a developing process may be performed to form a photoresist pattern. The photoresist pattern may be a mask pattern for forming a second pad contact electrically connected with a bit line. The photoresist pattern may have a shape exposing a first pad region P1 in FIG. 9. The first pad region P1 may be an upper portion of a center portion of each of the isolated active regions.

The first capping insulating layer 114 and the first mask pattern 106a may be etched by using the photoresist pattern as an etching mask to form a first opening portion 128. The first opening portion 128 may be formed to expose the first pad region and the device isolating region adjacent to the first pad region. In addition, an upper surface portion and an upper sidewall portion of the active region may be exposed through a bottom portion of the first opening portion 128.

At the sidewall of the first opening portion 128, the first mask pattern 106a including silicon oxide and the first capping insulating layer 114 including silicon nitride may be exposed. Particularly, the first mask pattern 106a including silicon oxide may be exposed to the sidewall of the first opening portion 128 in the cross-sectional view cut across the first opening portion 128 in the first direction. In addition, the first capping insulating layer 114 including silicon nitride may be exposed to the sidewall of the first opening portion 128 in the cross-sectional view cut across the first opening portion 128 in a second direction which is perpendicular to the first direction.

Figure 15:
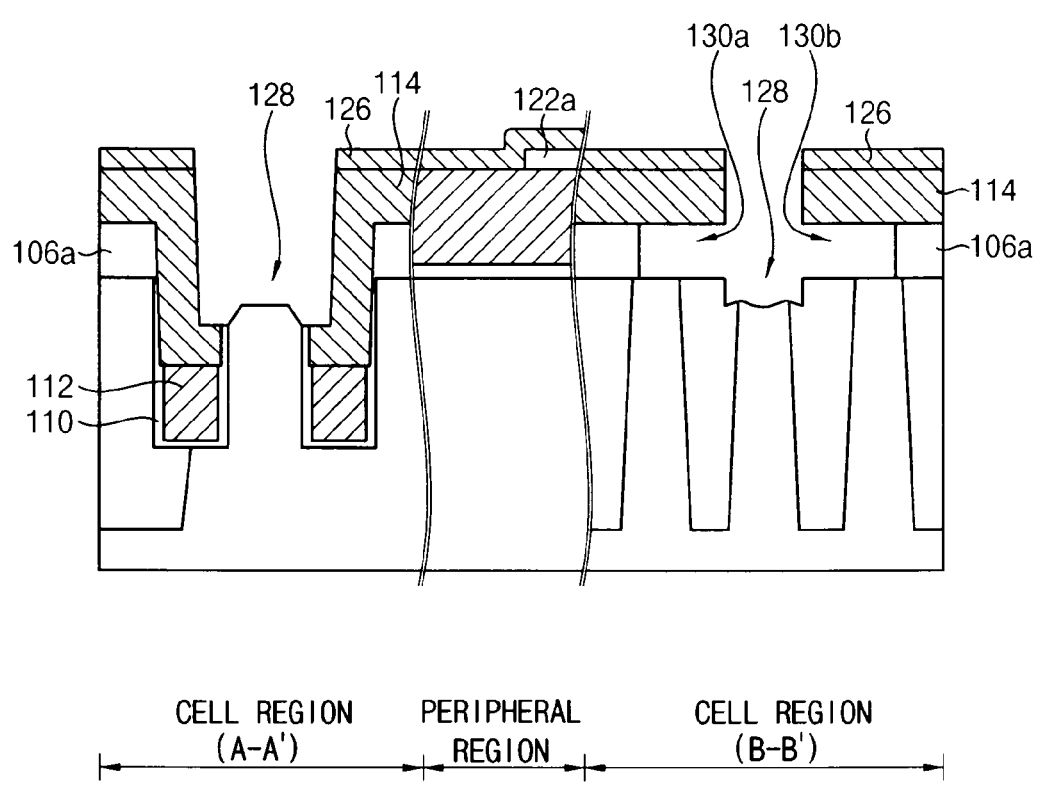
Figure 16:
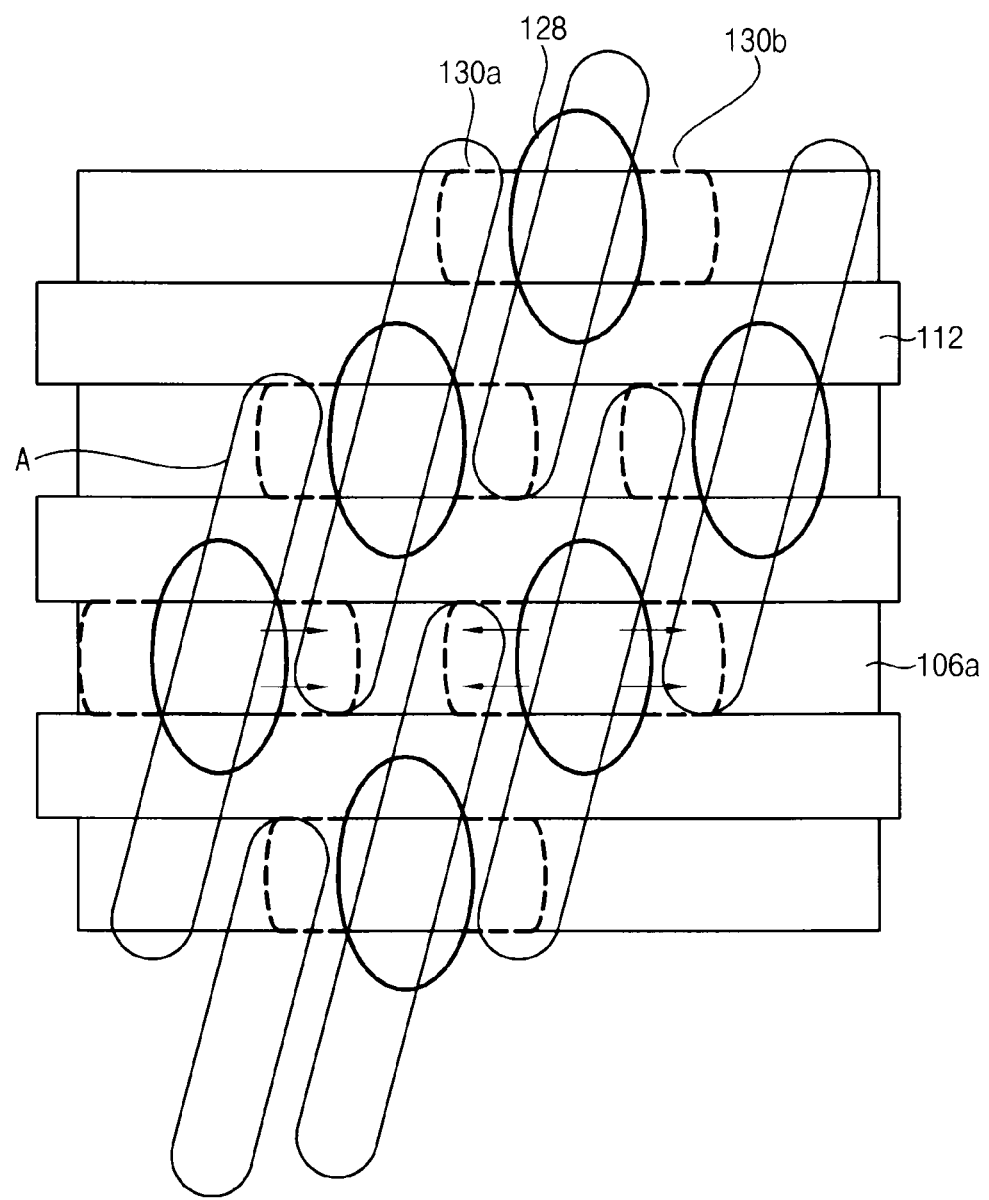

Referring to FIGS. 15 and 16, the first mask pattern 106a exposed to the sidewall of the first opening portion 128 may be selectively removed by a wet etching process to form a first groove 130a and a second groove 130b at both lower sidewall portions of the first opening portion 128. In the cross-sectional view in the first direction, the groove positioned at a left side in the first opening 128 may be called as the first groove 130a, and the groove positioned at a right side in the first opening 128 may be called as the second groove 130b in FIG. 15.

As described above, the exposed first mask pattern 106a at both sidewall portions in the first direction may be (partially) removed by the wet etching process to form the first and second grooves 130a and 130b. In this case, the first capping insulating layer 114 including silicon nitride may not be removed by the wet etching process, and may be disposed in the second direction. Accordingly, the first and second grooves 130a and 130b may be formed only at both sidewall portions of the first opening portion 128.

The first and second grooves 130a and 130b may be formed to expose the second pad regions P2 in an isolated active region adjacent to the first pad region P1. That is, the first and second grooves 130a and 130b may expose one of both end portions of the isolated active region.

Particularly, the first groove 130a may expose the second pad region in the isolated active region adjacent to the first pad region on the left side in the first direction, and the second groove 130b may expose the second pad region in the isolated active region adjacent to the first pad region on the right side in the first direction. In this case, the wet etching process condition may be controlled so that the first and second grooves 130a and 130b may not be over-etched. The over-etching of the first and second grooves 130a and 130b may penetrate the adjacent first opening portions 128 in the first direction. Particularly, an area of the upper surface portion of the active region exposed by the first and second grooves 130a and 130b may become larger while preventing the penetration of the first openings 128 adjacent to each other in the first direction by the first and second grooves 130a and 130b.

Because the first and second grooves 130a and 130b may be formed by performing the wet etching process, plasma damage may not be generated on the surface portion of the substrate in the active region while performing the forming process of the first and second grooves 130a and 130b. In addition, the surface portion of the substrate may be rarely lost (or, alternatively, removed) while performing the forming process of the first and second grooves 130a and 130b.

Figure 17:
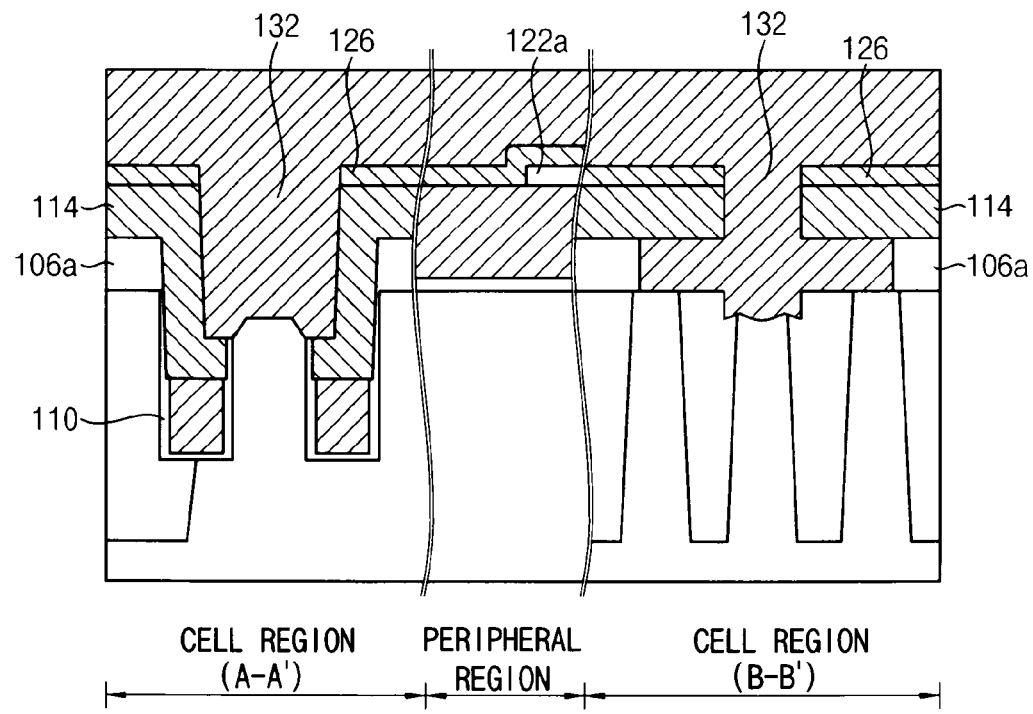

Referring to FIG. 17, a conductive layer 132 completely filling up the first and second grooves 130a and 130b and an inner portion of the first opening portion 128 may be formed. The conductive layer 132 may be a layer for forming a second pad contact configured for electrically connecting with a storage node electrode. The conductive layer 132 may be an impurity doped polysilicon.

Particularly, a polysilicon layer may be formed through a chemical vapor deposition process to completely fill up the inner portion of the first opening portion 128 including the first and second grooves 130a and 130b to obtain the conductive layer 132. Alternatively, the conductive layer 132 may be formed through an epitaxial growing process on the substrate. Silicon material may be grown in the first opening portion 128 including the first and second grooves 130a and 130b to form the conductive layer 132. The epitaxial growing process may include a selective epitaxial growing process, a laser-induced epitaxial growth (LEG) process, etc.

Figure 18:
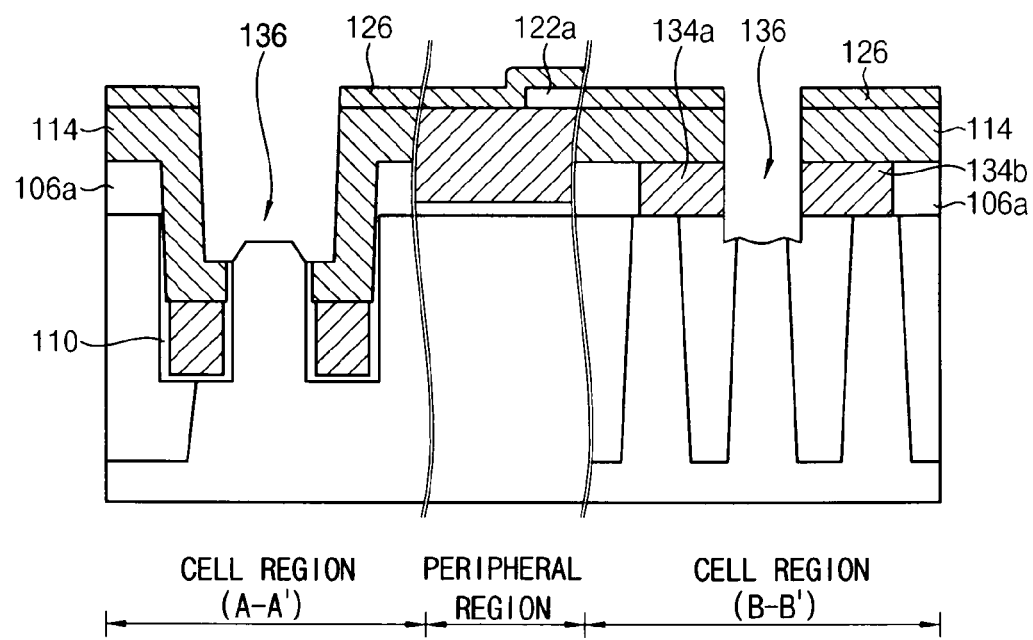

Referring to FIG. 18, the conductive layer 132 may be etched back to remove the conductive layer 132 in the first opening portion 128. Then, the conductive material filling up the inner portions of the first and second grooves 130a and 130b may remain to form second pad contacts 134a and 134b in the first and second grooves 130a and 130b, respectively. Because the first capping insulating layer 114 may function as an etching mask, the conductive layer 132 may be etched without using a separate etching mask. In addition, the conductive layer 132 filling up the inner portion of only the first opening portion 128 may be removed. A second opening portion 136 having the same shape as the first opening portion 128 and exposing the first pad region may be formed by etching back the conductive layer 132.

As described above, the second pad contacts 134a and 134b may be formed by performing the etching process to both sides of the first opening portion 128 to form grooves, and then filling up the grooves with a conductive material. In example embodiments, a common method of forming a second pad contact by etching layers in a vertical direction with respect to a substrate to form an opening portion exposing a second pad region, and then filling up the opening portion with a conductive material may not be applicable. Accordingly, problems possibly accompanied by the etching process in the vertical direction to form the opening portion including misalignment problem and an over-etching problem of the substrate in the active region may be solved. Because the misalignment problem may be decreased, a contacting area of the second pad contacts 134a and 134b with the substrate 100 corresponding to the second pad region may be increased in accordance with example embodiments.

Figure 19:
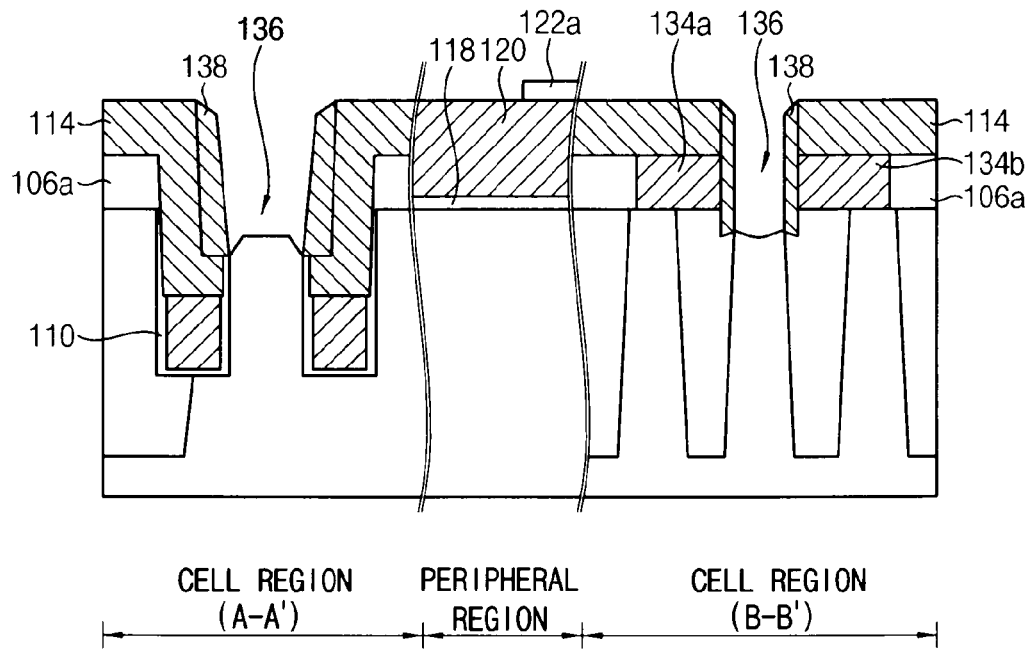

Referring to FIG. 19, a spacer insulating layer may be formed on exposed surface portions of the second capping layer 126, the second pad contacts 134a and 134b and the active region. The spacer insulating layer may be formed by depositing silicon nitride.

The spacer insulating layer may be anisotropically etched to form a spacer 138 on a sidewall of the second opening portion 136. The spacer 138 may be also formed on the exposed sidewall portions of the second pad contacts 134a and 134b. An inner width of the second opening portion 136 may be decreased by forming the spacer 138 on the sidewall of the second opening portion 136. Most of the second capping layer 126 may be removed and a portion of the first capping insulating layer 114 may be removed to a certain thickness while performing the forming process of the spacer 138.

Figure 20:
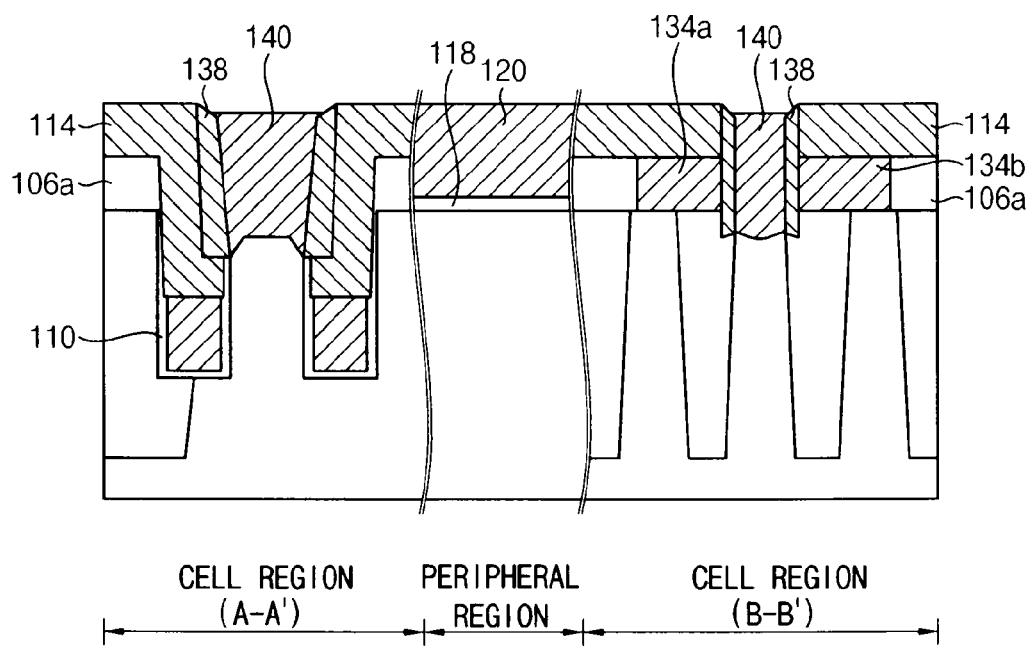

Referring to FIG. 20, a conductive layer may be formed to fill up the inner portion of the second opening portion 136 with a conductive material. The conductive layer may be an impurity doped polysilicon layer. A first pad contact 140 may be formed in the second opening portion by etching back the conductive layer.

The first pad contact 140 may be electrically insulated by the spacer 138 from the neighboring second pad contacts 134a and 134b in the first direction, respectively.

Figure 21:
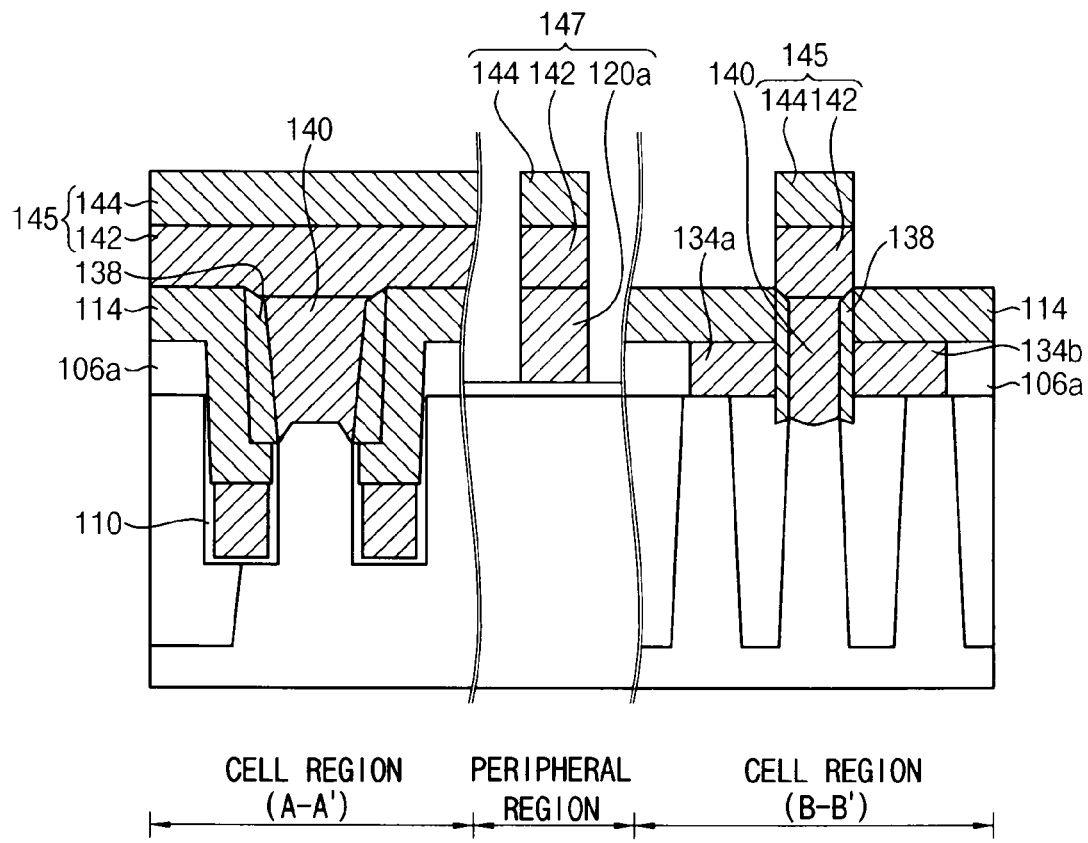

Referring to FIG. 21, a metal layer and a hard mask layer may be formed on the second pad contacts 134a and 134b, the first capping insulating layer 114 and the polysilicon layer 120. Particularly, the metal layer may be formed by depositing tungsten material. The hard mask layer may be formed by depositing silicon nitride.

Then, the hard mask layer may be patterned to form a hard mask pattern 144. In addition, the metal layer may be etched using the hard mask pattern 144 as an etching mask to form a metal pattern 142. The polysilicon layer 120 disposed in the peripheral region may be etched to form a polysilicon layer pattern 120a.

Bit line structure 145 making contact with the first pad contact 140 in the cell region may be formed by performing the above-described process. The bit line structure 145 may have an integrated shape of the metal pattern 142 and the hard mask pattern 144, and may extend in the second direction.

In the peripheral region, a gate electrode 147 of a planar-type transistor may be formed. The gate electrode 147 may have an integrated shape of the polysilicon pattern 120a, the metal pattern 142 and the hard mask pattern 144.

Referring to FIG. 6A again, an insulating interlayer 146 covering the bit line structure 145 and the gate electrode 147 may be formed. Then, a storage node contact 148 configured for electrically connecting with the second pad contacts 134a and 134b may be formed. A capacitor 150 configured for electrically connecting with the storage node contact 148 may be formed.

FIGS. 22 to 25 are cross-sectional views for explaining a method of manufacturing a DRAM device illustrated in FIGS. 6A and 6B in accordance with still another example embodiment.

Figure 22:
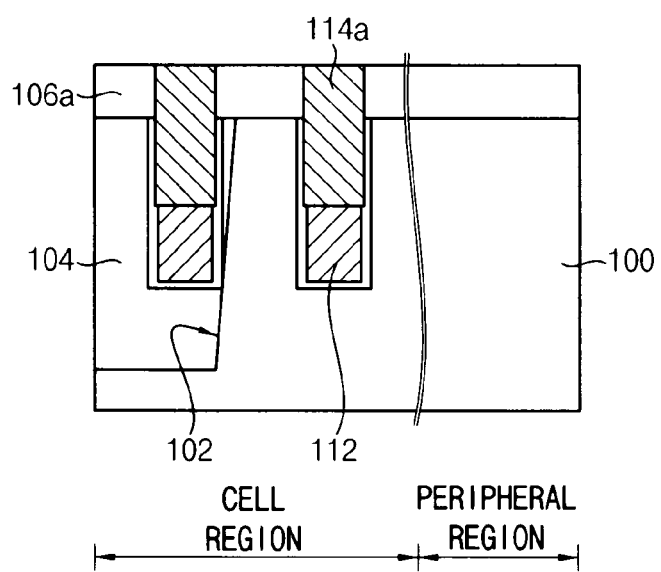

Referring to FIG. 22, a structure illustrated in FIG. 8 may be formed by performing processes described referring to FIGS. 7 and 8.

Then, a first capping insulating layer filling up an inner portion of the trenches 108 and covering the first mask pattern 106a may be formed. The first capping insulating layer may be formed using a material having an etching selectivity with respect to the first mask pattern 106a. Particularly, the first capping insulating layer may be formed by depositing silicon nitride. The first capping insulating layer may be polished until an upper surface portion of the first mask pattern 106a may be exposed to form a first capping insulating layer pattern 114a.

Figure 23:
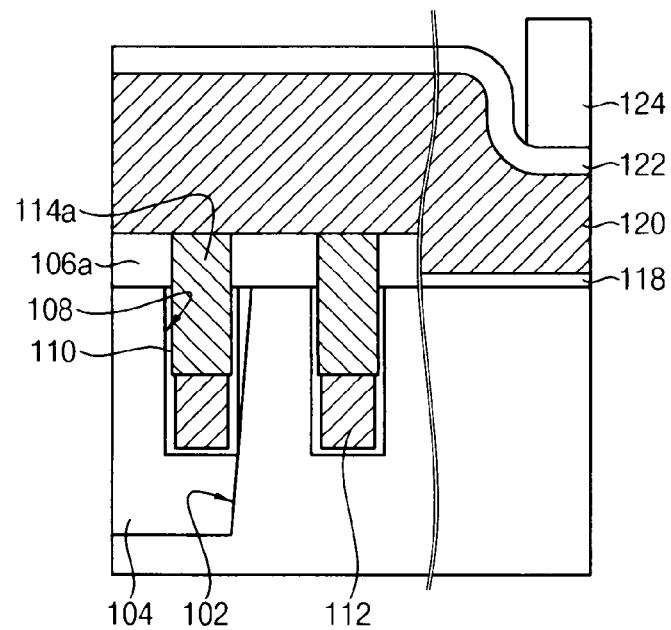

Referring to FIG. 23, a photoresist layer may be formed on the first capping insulating layer pattern 114a and the mask pattern 106a. An exposing process and a developing process may be performed to remove the photoresist layer in the peripheral region to form a first photoresist pattern (not illustrated) covering the substrate in the cell region. The first mask pattern 106a formed in the peripheral region may be removed using the photoresist pattern as an etching mask.

A gate insulating layer 118 and a polysilicon layer 120 may be formed on the substrate 100 in the peripheral region, the first capping insulating layer pattern 114a and the first mask pattern 106a. A second mask layer 122 may be formed on the polysilicon layer 120. The second mask layer 122 may be formed by depositing silicon oxide or silicon nitride.

A photoresist layer may be coated on the second mask layer 122. An exposing process and a developing process may be performed to remove the photoresist layer in the cell region to form a second photoresist pattern 124 covering the substrate in the peripheral region.

Figure 24:
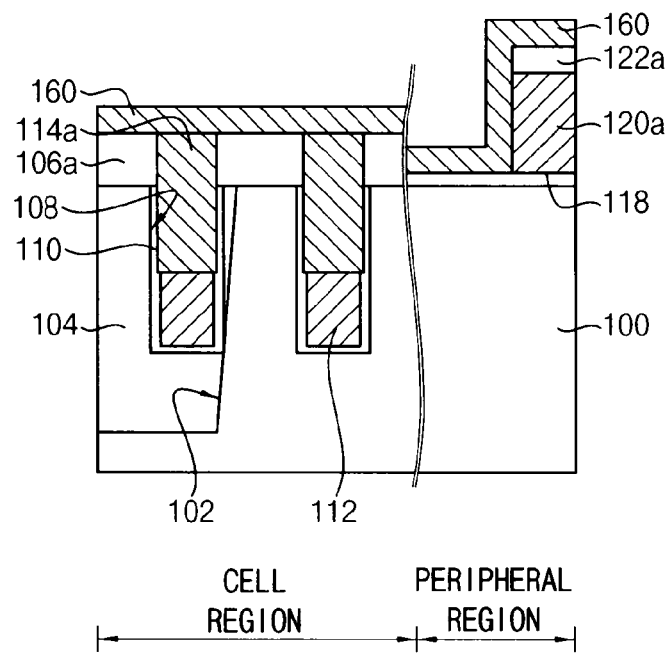

Referring to FIG. 24, the second mask layer 122 may be removed by performing an etch back process using the second photoresist pattern 124 as an etching mask. The polysilicon layer 120 may be removed. After completing the etch back process, the capping insulating layer pattern 114a and the first mask pattern 106a may be exposed at the uppermost portion of the substrate in the cell region. The gate insulating layer pattern 118, the polysilicon layer pattern 120a and the second mask pattern 122a may remain on the substrate in the peripheral region.

A second capping layer 160 may be formed on an upper surface portion of the first capping insulating layer pattern 114a, the polysilicon layer pattern 120a and the second mask pattern 122a. The second capping layer 160 may be formed by depositing silicon nitride.

Figure 25:
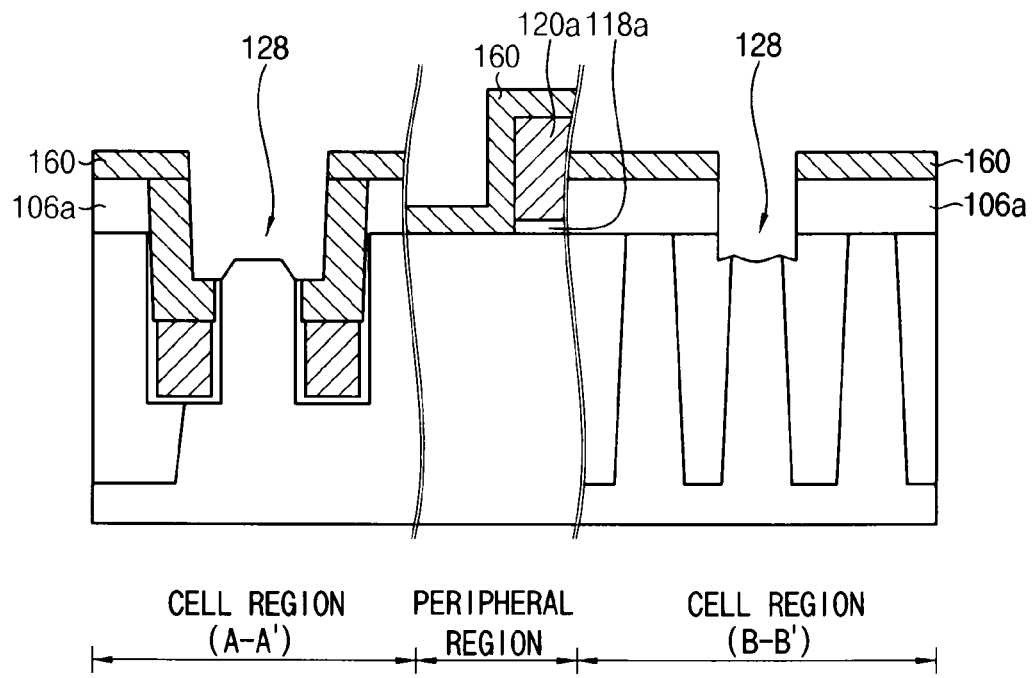

Referring to FIG. 25, a photoresist layer (not shown) may be coated on the second capping layer 160. An exposing process and a developing process may be performed to form a third photoresist pattern (not illustrated). The third photoresist pattern may be an etching mask pattern for forming a second pad contact electrically connecting with a bit line.

The second capping layer 160, the first capping insulating layer pattern 114a and the first mask pattern 106a may be etched using the third photoresist pattern as an etching mask to form a first opening portion 128. The position of the first opening portion 128 may be the same as illustrated in FIG. 14.

The sidewall of the first opening portion 128 may include an exposed portion of the first mask pattern 106a including silicon oxide, and an exposed portion of the second capping insulating layer pattern 160 including silicon nitride.

After that, the same processes described referring to FIGS. 15 to 21 may be performed. A portion of the exposed first mask pattern to the sidewall of the first opening portion may be etched to form a groove, and a second pad contact may be formed in the groove. In addition, a spacer of an insulating material may be formed on both sidewalls of the second pad contact. Then, a conductive material may fill up a gap between the second pad contacts to form a first pad contact.

A DRAM device illustrated in FIGS. 6A and 6B may be manufactured.

Hereinafter, various applications including the DRAM device in accordance with example embodiments may be explained. The DRAM device may be packaged to form a DRAM chip. Some embodiments among various applications may be illustrated.

Figure 26:
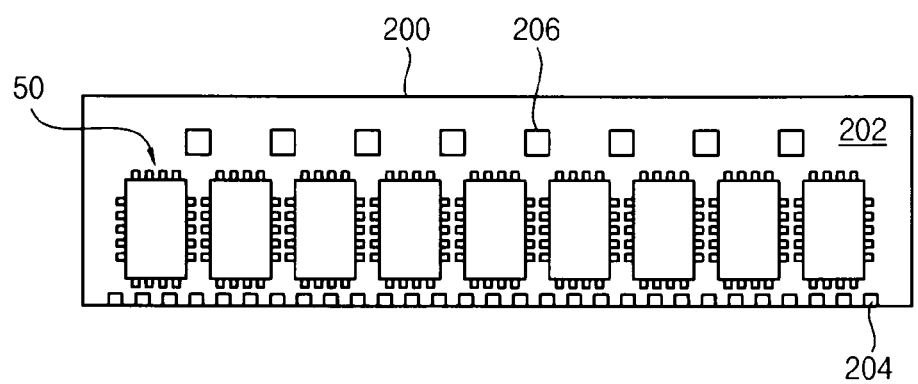

FIG. 26 is a plan view of a memory module including a DRAM chip having a DRAM device in accordance with yet another example embodiment.

Referring to FIG. 26, integrated DRAM semiconductor devices in accordance with example embodiments may be respectively packaged to form DRAM chips 50. The DRAM chips 50 may be applied for manufacturing a memory module 200. The memory module 200 may include a module substrate 202 and the DRAM chips 50 attached on the module substrate 202. The memory module 200 may also include a connecting portion 204 at one side of the module substrate 202. The connecting portion 204 may be inserted into a socket in a mother board. On the module substrate 202, a ceramic decoupling capacitor 206 may be disposed. The memory module 200 in accordance with example embodiments may not be limited to the shape illustrated in FIG. 25 but may have various shapes.

Figure 27:
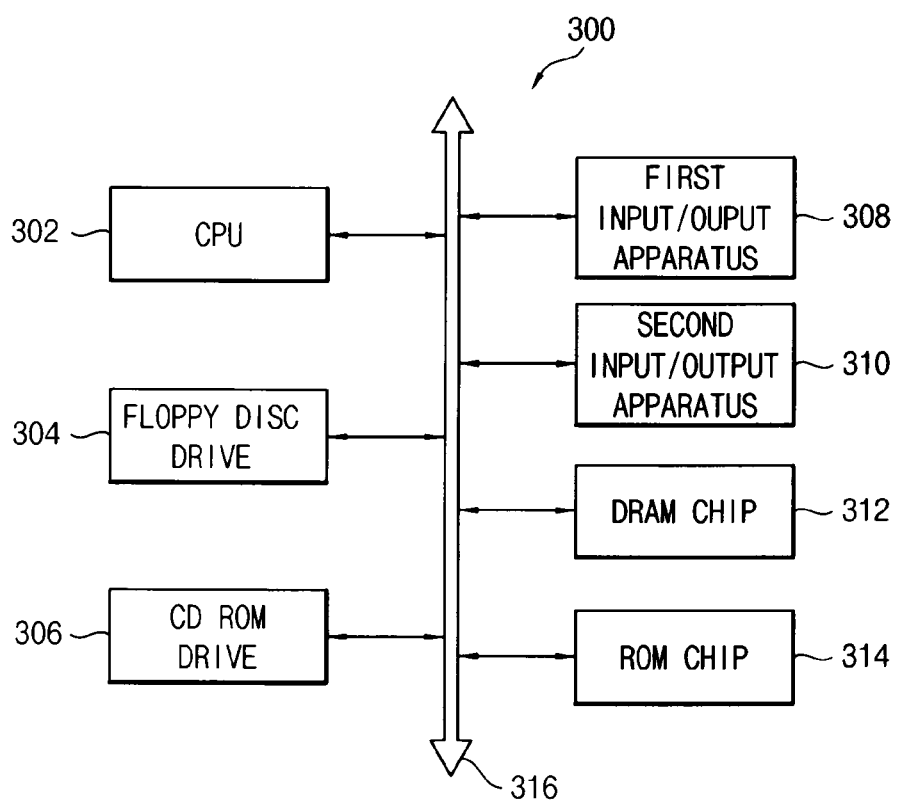

FIG. 27 is a block diagram of an electronic system including a DRAM chip having a DRAM device in accordance with still yet another example embodiment.

Particularly, an electronic system 300 in accordance with this example embodiment may be a computer. The electronic system 300 may include a central processing unit (CPU) 302, a surrounding apparatus including a floppy disc drive 304 and a compact disc read only memory (CD ROM) drive 306, first and second input/output apparatuses 308 and 310, a DRAM chip 312, a ROM chip 314, etc. Each of the above described parts may exchange a control signal or data using a communication channel 316. The DRAM chip 312 may be replaced by the memory module 200 including the DRAM chips 50 as illustrated in FIG. 25.

As described above, a DRAM device including pad electrodes having a large contacting area with a substrate may be provided in accordance with example embodiments. In the DRAM device, damage onto the substrate under the pad electrodes may be prevented. Accordingly, the DRAM device may have a good performance. The DRAM device may be applied for electronic appliances including a memory system, a display system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages. Accordingly, all such modifications are intended to be included within the scope of the application as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a dynamic random access memory (DRAM) device, comprising:
   forming a mask pattern of a first insulating material on a substrate including an active region having an island shape;
   forming a buried gate pattern extending in a first direction, the buried gate pattern being within the substrate and between portions of the mask pattern;
   forming a capping insulating layer of a second insulating material different from the first insulating material on the buried gate pattern and the portions of the mask pattern, the capping insulating layer filling up a gap between the portions of the mask pattern;
   forming an opening portion penetrating the capping insulating layer and the mask pattern to expose a first portion of the active region;
   etching a side portion of the mask pattern at both sides in the first direction in the opening portion to form a first groove and a second groove exposing a second portion of the active region adjacent to the opening portion;
   forming second pad contacts in the first and second grooves, the second pad contacts contacting the second portion of the active region;
   forming a spacer on a sidewall of the opening portion and on an exposed sidewall of the second pad contacts;
   forming a first pad contact in the opening portion including the spacer, the first pad contact contacting the first portion of the active region; and
   forming a bit line configured to electrically connect with the first pad contact; and
   forming a capacitor configured to electrically connect with the second pad contacts.

2. The method of manufacturing a DRAM device of claim 1, wherein the forming a buried gate pattern comprises:
   etching the substrate using the mask pattern as an etching mask to form a trench;
   forming a gate insulating layer on an inner wall of the trench;
   forming a conductive layer filling up the trench on the gate insulating layer; and
   etching back the conductive layer to form the buried gate pattern filling up a lower portion of the trench.

3. The method of manufacturing a DRAM device of claim 1, wherein the first insulating material of the mask pattern has a different etching selectivity than the second insulating material of the first capping insulating layer.

4. The method of manufacturing a DRAM device of claim 3, wherein the mask pattern is formed using silicon oxide, and the first capping insulating layer is formed using silicon nitride.

5. The method of manufacturing a DRAM device of claim 1, wherein the etching a side portion of the mask pattern to form the first and second grooves includes performing a wet etching process.

6. The method of manufacturing a DRAM device of claim 1, wherein a first upper surface portion of the substrate exposed by a bottom portion of the opening portion is positioned at a lower level than a second upper surface portion of the substrate exposed by the first and second grooves.

7. The method of manufacturing a DRAM device of claim 1, wherein the forming second pad contacts in the first and second grooves comprises:
   forming a conductive layer filling up the first and second grooves and the opening portion; and
   anisotropically etching the conductive layer to expose a surface portion of the substrate using the first capping insulating layer as an etching mask.

8. The method of manufacturing a DRAM device of claim 7, wherein,
   the conductive layer includes a silicon material layer, and the silicon material layer is formed by performing a chemical vapor deposition process or an epitaxial process.

9. The method of manufacturing a DRAM device of claim 1, wherein the mask pattern is formed higher than a height of the second pad contacts.

10. The method of manufacturing a DRAM device of claim 1, wherein the mask pattern remains on a sidewall of the first and second grooves after forming the first and second grooves.

11. The method of manufacturing a DRAM device of claim 1, wherein,
the substrate is separated into a cell region and a peripheral region, and
the method further comprises:
removing the capping insulating layer formed on the substrate in the peripheral region; and
forming a planar-type transistor on the substrate excluding the capping insulating layer in the peripheral region.

12. A method of manufacturing a dynamic random access memory (DRAM) device, comprising:
forming a gate structure over substrate including an active region having an island shape, the gate structure including a mask pattern, a buried gate pattern extending in a first direction and partially filling a trench in the substrate, and a first capping insulating layer over the buried gate pattern and the mask pattern,
the buried gate and the mask pattern being alternately arranged in a second direction substantially perpendicular to the first direction,
the first capping insulating layer filling a remaining portion of the trench, and the first capping insulating layer being formed of an insulating material that has a different etching selectivity with respect to that of the mask pattern;
forming an opening portion penetrating the gate structure to expose a first portion of the active region;
partially etching sidewalls of the mask pattern along the first direction in the opening portion to form a first groove and a second groove configured to expose a second portion of the active region adjacent to the opening portion;
forming second pad contacts in the first and second grooves, a lower surface of the second pad contacts contacting a first upper surface portion of the substrate corresponding to the second portion in the active region;
forming a spacer partially filling the opening portion and on exposed sidewalls of the second pad contacts;
forming a first pad contact filling in a remaining portion of the opening portion, a lower surface of the first pad contact contacting a second upper surface portion of the substrate corresponding to the first portion of the active region;
forming a bit line configured to electrically connect with the first pad contact;
and forming a capacitor configured to electrically connect with the second pad contacts.

13. The method of manufacturing a DRAM device of claim 12, wherein partially etching sidewalls of the mask pattern to form the first and second grooves includes selectively removing other portions of the mask pattern by performing a wet etching process.

14. The method of manufacturing a DRAM device of claim 12, wherein forming the opening portion comprises:
forming a capping insulating layer pattern over the buried gate pattern by etching the first capping insulating layer;
forming a second capping insulating layer over an upper surface of the first capping insulating layer pattern; and
etching the second capping insulating layer, the first capping insulating layer pattern and the first mask pattern to form the opening portion.

15. The method of manufacturing a DRAM device of claim 12, wherein the mask pattern partially overlaps with the second pad contacts in a vertical direction.

16. The method of manufacturing a DRAM device of claim 12, wherein the second upper surface portion is higher than the first upper surface portion.

* * * * *